United States Patent [19]

Bacon et al.

[11] Patent Number: 4,612,532

[45] Date of Patent: Sep. 16, 1986

[54] DATA COMPRESSION APPARATUS AND METHOD

[75] Inventors: Francis L. Bacon; Donald J. Houde, both of Wayland, Mass.

[73] Assignee: Telebyte Corportion, Natick, Mass.

[21] Appl. No.: 622,547

[22] Filed: Jun. 19, 1984

[51] Int. Cl.$^4$ .............................................. H03M 7/00
[52] U.S. Cl. ............................................ 340/347 DD
[58] Field of Search ................ 340/347 DD; 358/261; 178/17.5, 2 R, 79

[56] References Cited

U.S. PATENT DOCUMENTS

| | | | |
|---|---|---|---|
| 3,237,170 | 2/1966 | Blasbalg | 340/172.5 |
| 3,694,813 | 9/1972 | Loh | 340/172.5 |
| 3,835,467 | 9/1974 | Woodrum | 340/347 DD |

FOREIGN PATENT DOCUMENTS 0079442 3/1983 European Pat. Off. .

OTHER PUBLICATIONS

IBM Technical Disclosure Bulletin, vol. 24, No. 5, Oct. 1981.
Computer Design, vol. 16, No. 4, Apr. 1977, Dishon, "Data Compaction in Computer Systems".
IEEE Transactions on Information Theory, vol. IT-24, No. 6, Nov. 1978, Gallagher, "Variations on a Theme by Huffman".

Primary Examiner—Bernard Roskoski
Attorney, Agent, or Firm—Bromberg, Sunstein & McGregor

[57] ABSTRACT

A preferred embodiment of the invention provides a system for the dynamic encoding of a stream of characters. In a preferred embodiment, the system includes an input for receiving a stream of characters, and an output for providing encoded data. The system also includes a provision for storing, accessing, and updating a table (what I call a "followset" table) for each of a plurality of characters, listing candidates for the character which may follow, in the stream, the character with which the table is associated. The system also includes a provision for furnishing at the output, for a given character in the stream at the input, a signal indicative of the position, occupied by the given character, in the followset character which immediately precedes the given character in the stream of the input. A preferred embodiment of the invention also provides a system for decoding the encoded data, wherein the decoder utilizes a followset table.

18 Claims, 24 Drawing Figures

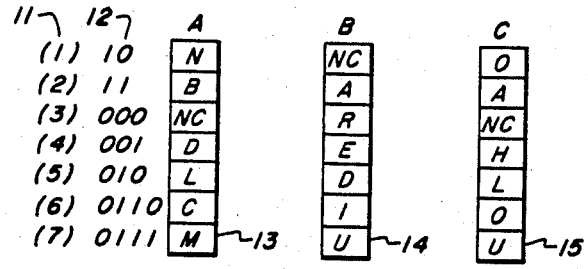
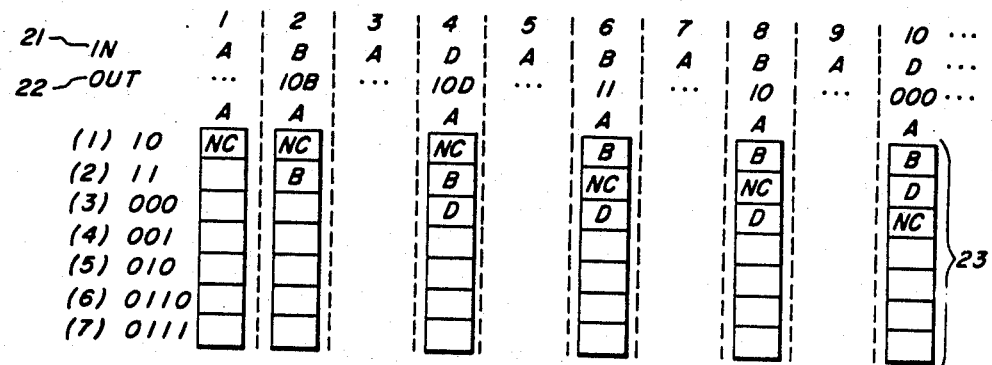
FIG. 2A
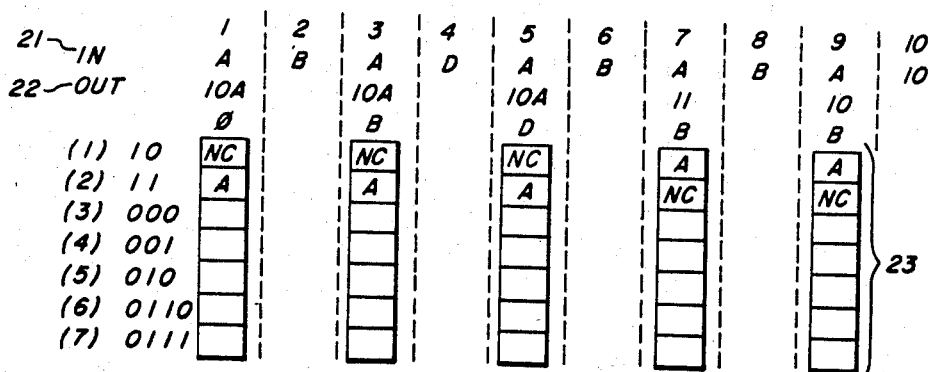
FIG. 2B
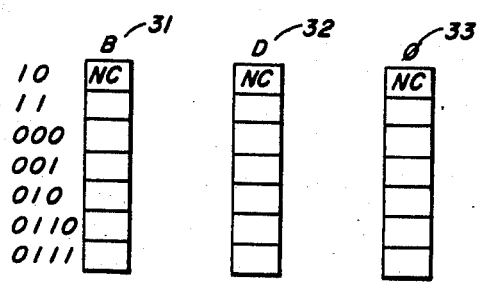
FIG. 3

| FIG. 7A | FIG. 7B | FIG. 7C | FIG. 7D | FIG. 7E |
|---|---|---|---|---|
| 1 | 1 | 1 | 1 | 10 |
| 0 | 00 | 00 | 00 | 11 |
|   | 01 | 010 | 010 | 000 |
|   |   | 011 | 0110 | 001 |
|   |   |   | 0111 | 010 |
|   |   |   |   | 011 |

| FIG. 7F | FIG. 7G | FIG. 7H | FIG. 7I | FIG. 7J |
|---|---|---|---|---|
| 10 | 10 | 10 | 10 | 10 |
| 11 | 11 | 11 | 11 | 11 |
| 000 | 000 | 000 | 000 | 000 |
| 001 | 001 | 001 | 001 | 001 |
| 010 | 0100 | 0100 | 0100 | 0100 |
| 0110 | 0101 | 0101 | 0101 | 0101 |
| 0111 | 0110 | 0110 | 01100 | 01100 |
|   | 0111 | 01110 | 01101 | 01101 |
|   |   | 01111 | 01110 | 01110 |
|   |   |   | 01111 | 011110 |
|   |   |   |   | 011111 |

| FIG. 7K | FIG. 7L | FIG. 7M | FIG. 7N | FIG. 7O |
|---|---|---|---|---|
| 10 | 10 | 10 | 10 | 10 |
| 11 | 11 | 11 | 11 | 11 |
| 000 | 000 | 000 | 000 | 000 |
| 001 | 0010 | 0010 | 0010 | 0010 |
| 0100 | 0011 | 0011 | 0011 | 0011 |
| 0101 | 0100 | 0100 | 01000 | 01000 |
| 01100 | 01010 | 01010 | 01001 | 01001 |
| 01101 | 01011 | 01011 | 01010 | 01010 |
| 01100 | 01100 | 01100 | 01011 | 01011 |
| 01101 | 01101 | 01101 | 01100 | 01100 |
| 01110 | 01110 | 011100 | 01101 | 01101 |
| 01111 | 011110 | 011101 | 011100 | 011011 |
|   | 011111 | 011110 | 011101 | 011100 |
|   |   | 011111 | 011110 | 011101 |
|   |   |   | 011111 | 011110 |
|   |   |   |   | 011111 |

FIG. 9

| ORDINAL NUMERAL | BINARY ZONE | BINARY DIGIT |
|---|---|---|
| 0 | 0 | 0000 |
| 1 | 0 | 0001 |
| 2 | 0 | 0010 |
| ⋮ | ⋮ | ⋮ |
| 13 | 0 | 1101 |
| 14 | 0 | 1110 |
| 15 | 0 | 1111 |
| 16 | 10 | 0000 |
| 17 | 10 | 0001 |
| 18 | 10 | 0010 |
| ⋮ | ⋮ | ⋮ |
| 29 | 10 | 1101 |
| 30 | 10 | 1110 |
| 31 | 10 | 1111 |
| 32 | 110 | 00000 |
| 33 | 110 | 00001 |
| 34 | 110 | 00010 |
| ⋮ | ⋮ | ⋮ |
| 61 | 110 | 11101 |
| 62 | 110 | 11110 |
| 63 | 110 | 11111 |
| 64 | 111 | 000000 |
| 65 | 111 | 000001 |
| 66 | 111 | 000010 |
| ⋮ | ⋮ | ⋮ |
| 125 | 111 | 111101 |
| 126 | 111 | 111110 |
| 127 | 111 | 111111 |

4,612,532

DATA COMPRESSION APPARATUS AND METHOD

TECHNICAL FIELD

The present invention relates to devices of the type used for compressing data that is stored or transmitted and thereafter for restoring data to its original form.

The program listing in the attached Appendix is hereby incorporated herein by reference.

BACKGROUND OF THE INVENTION

Devices for compression and corresponding expansion of data are known in the art.

It is known in a data transfer terminal to compress the transmittal data by providing a fixed library of commonly used phrases at the receiver, and upon the occurrence of one of the phrases, transmitting only the address of that phrase. Such a device is shown in U.S. Pat. No. 4,107,457 issued Aug. 15, 1978 for an invention of Thomas M. Hajduk.

It is also known to check directly, consecutive repetitions of a character and transmit only the character code and repetition count, as shown in the device of U.S. Pat. No. 4,192,966 issued Mar. 11, 1980 for an invention of Mark Mayer.

DISCLOSURE OF INVENTION

A preferred embodiment of the invention provides a system for the dynamic encoding of a stream of characters. In a preferred embodiment, the system includes an input for receiving a stream of characters, and an output for providing encoded data. The system also includes a provision for storing, accessing, and updating a table (what I call a "followset" table) for each of a plurality of characters, listing candidates for the character which may follow, in the stream, the character with which the table is associated. The system also includes a provision for furnishing at the output, for a given character in the stream at the input, a signal indicative of the position, occupied by the given character, in the followset character which immediately precedes the given character in the stream at the input. A preferred embodiment of the invention also provides a system for decoding the encoded data, wherein the decoder utilizes a followset table.

BRIEF DESCRIPTION OF THE DRAWINGS

These and other features of the invention will be more readily understood by the following detailed description taken with the accompanying drawings, in which:

FIGS. 1, 2A, 2B, and 3 show tables stored in a simplified embodiment of an encoding device in accordance with the present invention;

FIGS. 7A-7O presents the ENCODING.TABLE, which is used in the embodiment of FIG. 4 to generate binary numbers indicative of the position of a character in a "font" or "followset" as defined below;

FIG. 9 shows the ENCODER.NC.ENCODING.TABLE also used by the embodiment of FIG. 4 for new character encoding.

DESCRIPTION OF SPECIFIC EMBODIMENTS

Figure 4:
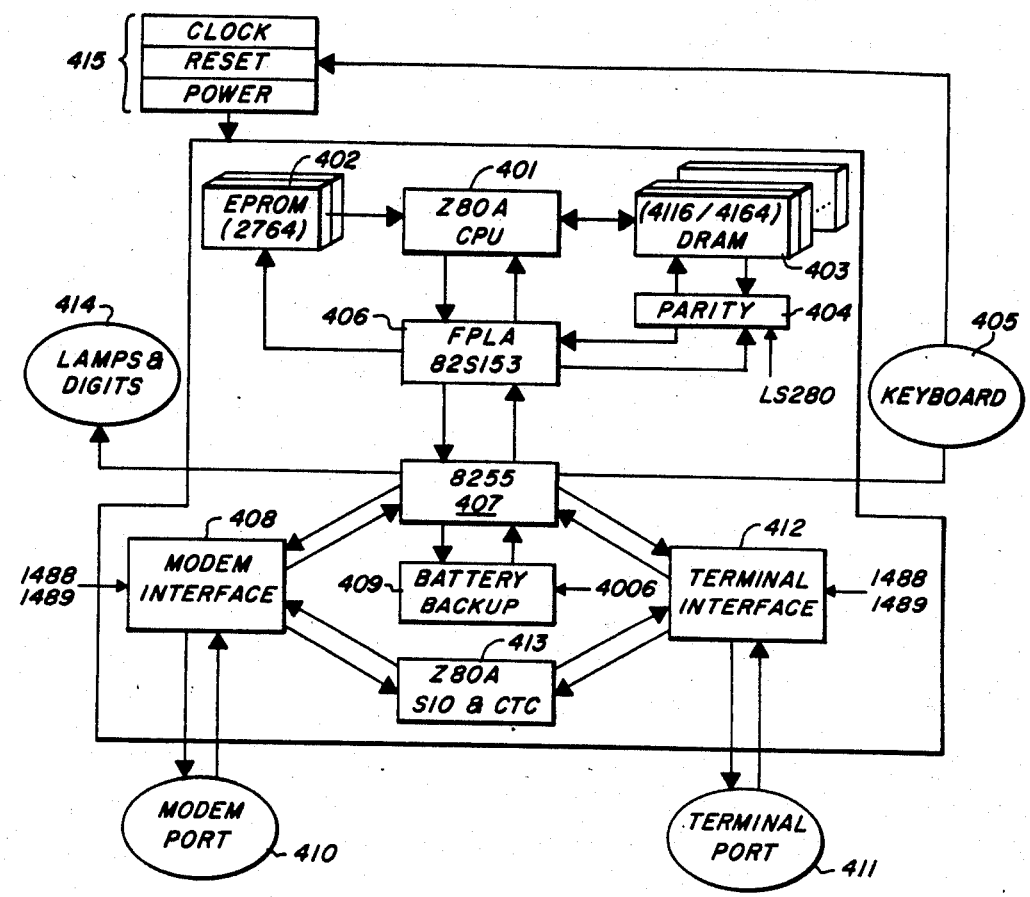
FIG. 4 shows a hardware implementation of a preferred embodiment of the present invention.

The invention relies on dynamically created tables in both an encoding device and a decoding device. A series of characters in a data stream is encoded in accordance with dynamically created tables in the encoding device. The decoding device is constructed in a manner to create corresponding tables for decoding of the encoded data, relying on the structure of the encoded data to create the decoding tables dynamically.

The compression scheme utilized in the invention relies on the assumption that the data being compressed is not random. In a preferred embodiment, the encoding device operates on binary encoded data occurring in serial form, wherein each character is represented by a fixed number of binary bits. The encoding device relies on the further assumption that a given character in a data stream has a more than random chance of being followed by one of a host of probable candidates for the next successive character. (It should be noted, however, that when this is not the case, although compression may not take place efficiently, data will not be lost.) In fact, in one embodiment, the encoding device effectively creates a table in which, for a given character, there is presented a list of candidates, in approximate order of local frequency of occurrence, for the next successive character that would occur in the data stream. Therefore, when the given character does occur in the data stream, followed by a character in the table, the encoding device sends a binary code to represent the latter character based on the character's ordinal position in the table. The code is shortest for the most frequently occurring candidates, and although longer for those candidates that are less frequently occurring, it is in such an embodiment never longer than the number of bits in the original character encoding, thereby permitting compression in situations where patterns of characters are present. Since the table is created based on the local frequency of occurrence of a character after a given character, the table is changed dynamically as the local frequency of occurrence changes.

A simplified data encoding device in accordance with the present invention would contain a table for each possible character of data, indicating, for such character, what candidates are most likely to follow such character in the data stream. The candidates most likely to follow are listed in the table in order of frequency of occurrence, with the most frequently occurring characters at the top of the table and those characters occurring less frequently at the bottom of the table. An example of some of the tables stored in this simplified embodiment is presented in FIG. 1, where items 13, 14, and 15 identify tables for the characters A, B, and C respectively. Thus, in table 13 of FIG. 1, N is the character occurring most frequently after the letter A, and B is the next most frequently occurring letter after A. The symbol NC stands for "new character", which refers to a situation wherein, in this example, a character other than one listed in table 13 would follow the letter A. The use of this symbol will be more apparent in further discussion. Column 11 identifies the position, in usual base 10 numbers, of entries in the table, and column 12 identifies the binary coding used to identify each position in the table. (It should be noted that normal binary ordinals are not used for the coding; a special set of binary numbers is used to facilitate unambiguous transmission of the position in the table.) Table 14 indicates that in the case of character B, the most likely candidate for the next character after B in the data stream is one other than in the list of table 14; the next most likely candidate for the character after the letter B is the letter A, and so forth.

As discussed, the tables 13 and following of FIG. 1 are not static, but are changed dynamically. The manner in which these tables are changed and utilized will now be described in connection with a data stream of characters as follows:

A B A D A B A B A D . . .

Let us consider the table in column 1 of FIG. 2. At the beginning of a message, a table may be considered as having only a single entry, namely NC, the new character symbol. The initial state of such a table is indicated in the first column of FIG. 2A, wherein the new character symbol occupies position 1 of the table and the positions 2 through 7 of the table are blank. That is, the encoding device expects that the most likely character to follow an A in the data stream will be a new character not present in the table.

Row 21 of FIG. 2A shows serially each character in the data stream that is an input to the encoding device. Row 22 of FIG. 2A shows serially the output generated by the data encoding device of this example for each character in row 21. (For purposes of illustration, however, consideration of the output generated for characters in columns 1, 3, 5, 7, and 9 will be deferred to a later part of this description.) It will be observed that characters in columns 2, 4, 6, 8, and 10 each follow the character A in the data stream. These characters will be coded for the output shown in row 22 by reference to the table for characters which follow the A character. Successive states of this table are shown in row 23 of FIG. 2. The letter B, occurring in column 2 of row 21, is not found in the table of column 1, so B will be identified in the output of the encoder as a new character. The encoder therefore provides at its output a symbol showing that a new character is going to follow, and then provides an output of the new character itself. Since the new character symbol occupies position (1) of the table in column 1, the output based on this table is binary 10 followed by the letter B.

At this point, however, there is more information available as to characters locally occurring after the letter A, so that the A table must be updated. The resulting updated table is shown in column 2 of FIG. 2A. Here the letter B has been identified as the character that follows letter A and is given binary code 11 in the table. Similarly, after transmission of the output for the character in column 3, there is presented for transmission the output for the letter D in column 4. The letter D follows the letter A, so recourse must be had again to the A table. Reference to the A table in its last state, as shown in column 2, does not reveal a D, so that the new character symbol, identified as binary code 10, is given as an output, followed by the letter D. Concurrently, the table must again be updated, and the letter D is made to occupy the position coded in binary as 000 of the table, as indicated in column 4.

Similarly, after transmission of a output for the character A in column 5, the next candidate for transmission is the output corresponding to the character B in column 6 of row 21. At this point, it can be seen that the current state of the A table (which is shown in column 4) includes a B in position coded in binary as 11. Consequently, the output for the input in column 6 is simply binary 11. That is, the position of B in the A table rather than B itself is what is given as the encoder's output.

In addition to providing the encoded output for this character, the encoder must also update the A table. Since the letter B previously occurred in the table, this letter is moved to a position one higher than it previously occupied, by interchanging its position with that of the character immediately above it. The effect of interchanging positions in this manner is to cause the table to list characters in the approximate order of their local frequency of occurrence after the letter A. In this case, therefore, the B changes places with the symbol for a new character. Consequently, when B is next to be coded in the encoder's output, in column 8, its output code is by reference to the A table in the state as indicated by column 6, namely, binary 10. In column 6, the letter B is already the most frequent character, so there is no further change made in this instance to update the A table. The state of the table shown in column 8 after transmission of the code for the character B in column 8 is therefore the same as the state of the table shown in column 6. However, after reaching the character D in column 10 for coding, the encoder causes an output of binary 000 and an interchange of the positions of D with the character above it, the new character symbol being treated as simply an additional character. The then updated state of the A table is shown in column 10.

At this juncture, it is useful to introduce some terminology. The set of characters listed in the A table in the above example I refer to as the A "followset" or the A "font". Thus I call the table 13 of FIG. 1 the A followset or A font; table 14, the B followset or B font; and table 15, the C followset or C font.

It is now possible to complete the description of operation of the simplified data encoding device discussed above. Let us consider the encoder output for the character in column 3 of row 21 in FIG. 2B. The immediately preceding output of the encoder identified the character B, so the encoder knows that the next character to be transmitted will be a member of the B followset. Since the character B was never encountered in the data stream previously, the B followset would have the appearance of table 31 in FIG. 3. That is, no characters are present in the B followset except the new character symbol, which occupies the position coded as binary 10. As indicated in FIG. 2B, the encoder output in column 3 of row 22 identifies the new character symbol by binary 10, followed by the identity of the new character, namely, A. The B followset 31 of FIG. 3 must then be updated to have the appearance of the table in column 3 of row 23 in FIG. 2B; the character A was added after the last entry in the table. When A next follows B, it occurs in column 7 of row 21. Again, in such instance, the character must be identified by reference to the B followset. The last state of the B followset is identified in column 3 of row 23; the character A may therefore be identified simply by the binary 11, and this number is given as the output of column 7 row 22. The second occurrence of A in the B followset causes the A to have a higher position in that followset, so A switches positions with the character immediately above it in the followset. The new state of the B followset is shown in column 7 of row 23.

The character A next appears after B in column 9 of row 31. Again the encoder makes reference to the B followset, the last state of which is as shown in column 7, and the character A is identified by binary code 10, which is given as the output in column 9 of row 22.

The A of column 5 in row 21 must be encoded as a member of the D followset. The initial state of the D followset is shown as table 32 in FIG. 3, so that there is provided as an output, in column 5 of row 22, the binary identifier 10 of the new character, followed by the letter A.

There remains to be discussed the output for the very first character in the data stream. The first character does not follow any given character, so the encoder device and decoding device both arbitrarily assume that the first character is a member of the followset of the character "null". The initial state of the null followset is shown as item 33 in FIG. 3. The output for the character A in column 1 of row 21 in FIG. 2B would therefore be the new character symbol, identified by binary code 10, followed by the character A. The null followset is then updated to have the form indicated in row 23 of column 1 in FIG. 2B.

The decoding device in accordance with this embodiment of the invention operates in a fashion analogous to the encoding device described above. It also maintains followset tables. Since, by definition, the pertinent followset table to be used in decoding a current encoded character is identified by the last character that has been decoded, the decoding device can correctly identify the pertinent followset table without receiving any information other than the encoded data stream. Moreover, the invention permits the encoded data stream to update and maintain synchronously the tables used in the decoding device, so that the tables in the decoding device and the encoding device are in constant correspondence with one another. The decoder thus updates its followset tables in the same manner as the encoder. Whereas the encoder utilizes the followset to derive a binary encoding from a given input character, the decoder utilizes an identical followset to convert the binary encoding into the original character.

The foregoing explanation of operation is simplified in a number of respects from a typical preferred embodiment to an encoder in accordance with the present invention. First, when a new character symbol is identified, and thereafter an output of a character is provided (as in the case, for example, of columns 2 and 4 of row 22) the character is identified by a specific binary code. There is a table that generates a code for such circumstances, and encodes the new character based on its position in a frequency table. (Simplified embodiments may avoid the use of a frequency table and transmit the equivalent of straight ASCII or EBCDIC representation for the new character.)

Second, each followset includes positions not for six characters plus the new character symbol, but for 15 characters plus the new character symbol. (Any other number could be used, but I have found that satisfactory results in many cases may be obtained with 15.) When a followset has been filled in accordance with the procedure described, any time a new character is encountered in the data stream, the encoder causes the new character to be substituted for the character occupying the bottom position of the followset, so that "stale" characters in the followset get removed.

Third, by the term "character" I mean not simply a letter but actually any type of information capable of being encoded in binary code according to a specified format; thus using the ASCII or EBCDIC standards, a comma or space is a character just as much as an upper case A or the number 9. (As explained in further detail below, the principles applied here to ASCII or EBCDIC may be applied to any fixed-length coding character set.)

Fourth, the position in a followset table is identified not simply (as explained below in connection with FIG. 7) by the given set of binary numbers shown in FIGS. 1 through 3B, but rather by a dynamically allocated set of binary numbers depending on the number of active characters (or positions) being used in that followset. With each followset is stored the number of active characters, so that a particular set of binary numbers can be used.

Fifth, the new character symbol is not physically stored in the followset. Instead with each followset is also stored a number that represents the theoretical position occupied by the new character symbol. This number is used in determining what binary code is sent to identify the new character symbol.

Sixth, when the encoder is using a new followset—one in which the only candidate is the new character symbol—the encoder's output can be shortened by avoiding altogether any transmission of the position of the new character symbol. That is, both the encoder and decoder know that in a new followset the only candidate is the new character symbol, and hence its position is already known. In such cases, the encoder simply provides an output directly of the new character encoding without being prefixed by the coding for the position of the new character symbol. Thus, for example, in col. 2 of FIG. 2A, the encoder is in the followset of A, a new followset, and in columns 1, 3, and 5 of FIG. 2B, the encoder is in the followset of null, B, and D, respectively, and each are new followsets at those points. Consequently the encoder and decoder may be designed so that the binary 10 in row 22 of those columns can be eliminated.

Lastly, a followset is not necessarily identified with a given single character. I have found in a preferred embodiment that a followset may be advantageously described by a character group of a particular sort. The character group that is employed in one preferred embodiment of the invention depends on classifying characters into five "Types" as follows:

Type I: the 26 capital letters A–Z;
Type II: the 26 lower case letters a–z;
Type III: the 10 decimal numbers 0–9;
Type IV: punctuation and symbols such as [,], [:], [;], [%], [$], [(], and [)];
Type V: data communication signals, such as control, backspace, null, line feed, and the like.

In a preferred embodiment, I identify a followset by a three element set, the last element of which is a given one of the 128 ASCII characters. The first two elements of this set are the Types of the two characters immediately preceding the given character in the data stream. As an example, the character D in column 4 of row 21 follows the character A. The letter A in column 3 in turn follows characters that are both of Type I. D would thus be identified as a member of the followset [Type I] [Type I] [A]. As used in the claims which follow, the term "Type" shall mean any classification of characters into groups, such as presented above, according to some system, permitting the association of a character with one of such groups. As used in this description and the claims following, the term "followset" is used in conjunction with any character or character group that is examined in accordance with the present invention to create a table, for such character or character group, of candidates for the position following such character or character group. Owing to the nature of ASCII and EBCDIC coding, I have found it convenient to use four rather than five Types. In ASCII, for example, the four possibilities for the two highest order bits of its binary coding may be directly used to identify each of four Types. These four Types correspond generally to the five Types described above, but with Types III and IV merged.

The approach described in the preceding paragraph results in there being created $4 \times 4 \times 128 = 2048$ total followsets. One could actually maintain all 2048 followsets in the memory of the encoding device, but I have found that this approach is not generally necessary. One could rank the followsets in order of recurrence and discard the ones that are least used; nevertheless, I have found that there is little loss in compression if one simply discards followsets on a cyclical basis, maintaining in memory an appropriate number of followsets most recently used. In order to accomplish this, it is useful to maintain in memory of the encoding device a list of all possible followsets to determine which of those have actually been created and maintained in memory. If a given followset is not in memory and is needed, it may be created and the followset that has been maintained in memory the longest is then discarded.

In the case where the data compressed is in EBCDIC, there are 256 characters. Because the present embodiment is designed for 128 characters, I have found that it may, with relatively little loss of compression, use a single set of fonts for two different characters. As an example, the same font may be invoked for [Type I] [Type I] [SOH (Start Of Heading character)] as for [Type I] [Type I] [a]. In establishing fonts for EBCDIC characters, the embodiment described in futher detail below sets the highest order bit in the pertinent character to zero, so that two characters produce the same set of fonts. (This procedure, however is not applied to transmission of a representation of a new character or to storage of a character in a font.) In this manner, the same number of fonts may be used regardless whether the data is ASCII or EBCDIC. Because the decoding and encoding devices always select the same font (even if the font may happen to be selected more often than otherwise, owing to the merger of sets of fonts for characters represented by common bits after the highest order bit), there is no ambiguity in the data transmitted or received.

FIG. 4 shows a hardware implementation of a preferred embodiment of the present invention. The invention includes a modem port 410 and a terminal port 411 for connection to a modem and terminal respectively. The invention both (i) processes encoded data received through the modem port 410, the decoded output of which appears at the terminal port 411, and (ii) processes the data stream received through the terminal port 411, the encoded output of which appears at the modem port 410. The central process is performed by a Z80A CPU, item 401, which receives clock, and power signals from unit 415 and a reset signal from unit 415 on suitable operation of the keyboard 405. In a manner known in the art, the CPU 401 is in communication with an EPROM, item 402, typically type 2764, and a RAM, item 403, typically type 4164 in a 64k version of the device or type 4116 in a 16k version of the same, which is subject to parity checking by item 404, typically type LS280. The modem interface 408 and the terminal interface 412 are typically Types 1488 and 1489. The Z80A SIO and CTC circuit, item 413, controls the relation of each interface to its respective port in a manner well known in the art.

Data interchange throughout the hardware is controlled by an FPLA, item 406, typically 82S153, and item 407, typically 8255. These chips manage output to the lamps and digits, item 414, and receive input from the keyboard, item 405. Pertinent device control information is preserved after AC power off in a battery backup circuit 409, typically type 4006.

Figure 5:
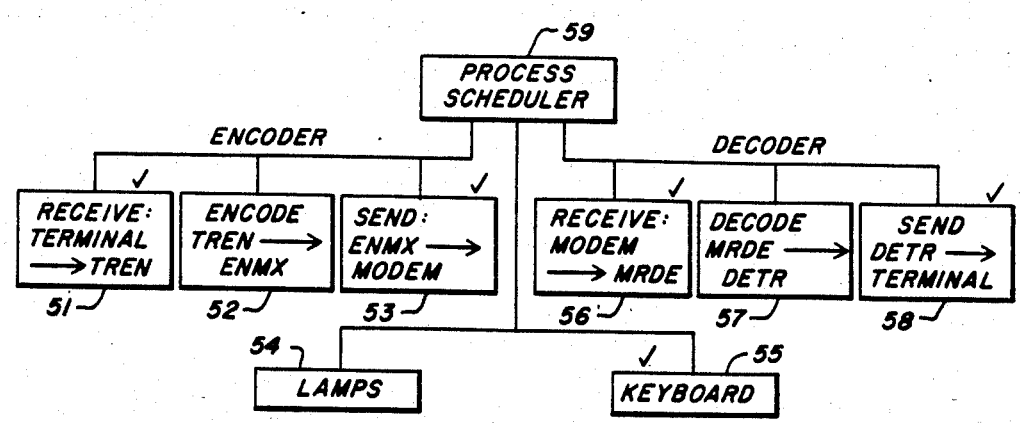
FIG. 5 is a block diagram illustrating the basic logical processes utilized in the embodiment of FIG. 4.

Turning now to FIG. 5, there is shown a block diagram which illustrates the basic logical processes implemented by a preferred embodiment of the present invention. Eight basic processes are performed; three relate specifically to encoding, three relate specifically to decoding and two additional ones, relating to operation of indicator lamps, item 54, and operation of the keyboard, item 55, perform management functions for the invention. These basic processes are supervised by a process scheduler 59 that operates in a fashion analogous to an operating system. The encoding process involves receiving input data from the terminal and loading it into a buffer identified as TREN, according to step 51; then taking data stored in the buffer TREN, encoding it, and loading the information into buffer ENMX, according to step 52; and finally, taking the data stored in buffer ENMX and outputing the information through the modem output in accordance with step 53. Analogously the decoder process involves receiving data from the modem and loading it into buffer MRDE, in accordance with item 56; then taking the data in buffer MRDE, decoding it and loading the decoded data into buffer DETX, in accordance with item 57; and finally, taking the data in buffer DETX and delivering it to the output for the terminal in accordance with item 58. The process scheduler 59 causes these functions generally to be handled cyclically as part of ordinary synchronous processing; however, functions identified by a check mark above the box are scheduled by an interrupt which permits processing to pass to those functions on a priority basis.

The data delivered to the modem output is in the form generally of an X25 protocol, in a manner well known in the art. The protocol involves transmission of the data in frames indicated by appropriate flags, the end of the frame being followed by a cyclical redundancy check (CRC). This technique can permit the devices to detect and correct errors between modem ports owing to transmission interference.

Figure 6:
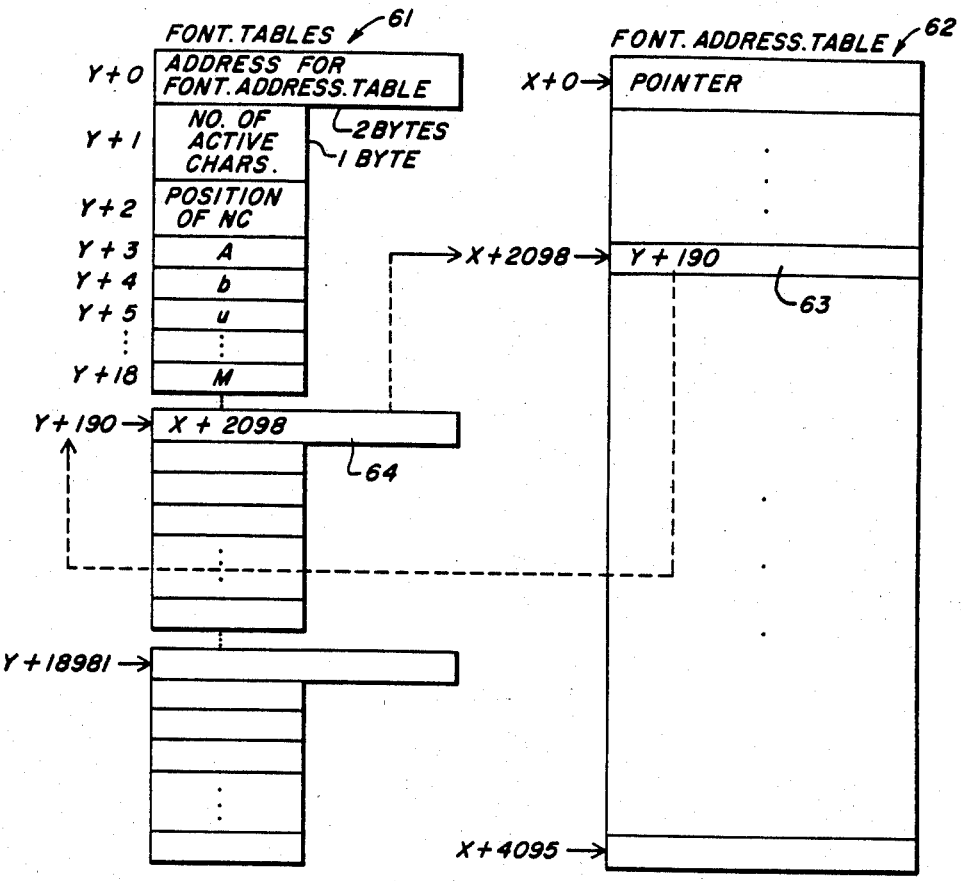
FIG. 6 illustrates the FONT.TABLES and FONT.ADDRESS.TABLE, which are the two most important tables used in the embodiment of FIG. 4 in both encoding and decoding of data.

The processing steps of the present invention can best be understood by recourse to FIG. 6, which illustrates the two most important tables used internally in both encoding and in decoding data. (Both the encoder portion of this embodiment and the decoder have a pair of these tables. In the Appendix, the encoder's or decoder's tables are separately labeled.) Item 61 is the FONT.TABLES, which are allocations of storage for a desired number of fonts to be preserved in active use in accordance with the invention. In the embodiment shown, each font has 15 positions for character storage, plus an additional position for the new character symbol. Each character can be identified by one byte of information, as well as the position of the new character symbol. An additional byte for a given font is used to store the number of active characters in the font. Finally, two bytes of information are used to store the address of that particular font in another table, namely the FONT.ADDRESS.TABLE, item 62, which will be discussed below. Thus in the present embodiment, 19 bytes of information are stored for each font in the FONT.TABLES. In a 64k version of the invention, there are stored 1,000 active fonts, each font occupying 19 bytes as described. In FIG. 6, the FONT.TABLES is shown beginning at memory location Y in memory.

The FONT.ADDRESS.TABLE is a table of two-byte pointers, wherein each pointer is used to identify the address of the first memory location of an assigned font in the FONT.TABLES. There is one pointer for each possible one of the fonts, including the fonts which are currently active in the FONT.TABLES and those which are currently inactive. Thus in a system using four Types and 128 characters, there would be a total of $4 \times 4 \times 128$ which equals 2048 pointers. A value of zero assigned to a pointer in the FONT.ADDRESS.TABLE means that there is no currently active font in the FONT.TABLES for the pertinent font.

The memory location for the pointer of a particular font is determined in accordance with an alogrithm using values for the elements comprising the font in accordance with a calculation as follows: $[(T.2 \times 4) + T.1] \times 2 + LC \times 32$, where LC is the binary value of the last character, T.2 is the Type value (ranging from 0 to 3 in binary) of the next to last character, and T.1 is the Type value of the character preceding T.2. To the result of the foregoing calculation is added the base memory location for this table to arrive at the final address value.

As an example, consider the font [Type II] [Type III] [A]. The character A is represented by the binary equivalent of decimal 65, so that application of the formula would yield $[(2 \times 4) + 1] \times 2 + (65 \times 32)$ which equals 2098. Assuming that the FONT.ADDRESS.TABLE begins at memory location X, this particular font has its pointer at location X+2098. This pointer is in fact a two-byte binary number, but let it be assumed that this number equals Y+190. The pointer is shown as item 63 in FIG. 6. This pointer, it will be recalled, identifies the memory location of the first position in the assigned font in the FONT.TABLES. Since the FONT.TABLES begins at memory location Y, the position Y+190 is shown at item 64 in FIG. 6. The first two bytes of this particular font include the address of its pointer in the FONT.ADDRESS.TABLE, namely X+2098.

The invention in a preferred embodiment also uses a number of other tables. One is the ENCODING.TABLE, illustrated in FIG. 7. It was mentioned above that the position of a character in a font is not indicated by a simple set of binary numbers. Thus, for example, if the font has only three entries as indicated by the bit indicating the number of active characters in the particular font, then the encoding table uses the binary system shown in FIG. 7B to identify the successive positions in the font. Similarly, if the font shows seven active characters, the positions in the font are identified by the binary number shown in FIG. 7F. It should be noted that the use of numbers in accordance with this scheme permits, first of all, efficient coding of positions high in a particular font and, second of all, an unambiguous system for the decoding device to determine when the last bit necessary to identify a position in a font has been received. A corresponding decoding table is used in decoding the binary numbers received to indicate their position in the pertinent font table. The decoding table is called DE.FONT.TABLE. This table is used in connection with DE.FONT.TABLE.INDEX. When the binary information is transmitted to identify the position occupied by the new character symbol in a given font table, there is transmitted thereafter a representation of the new character based on its position in a frequency table.

Figure 8:
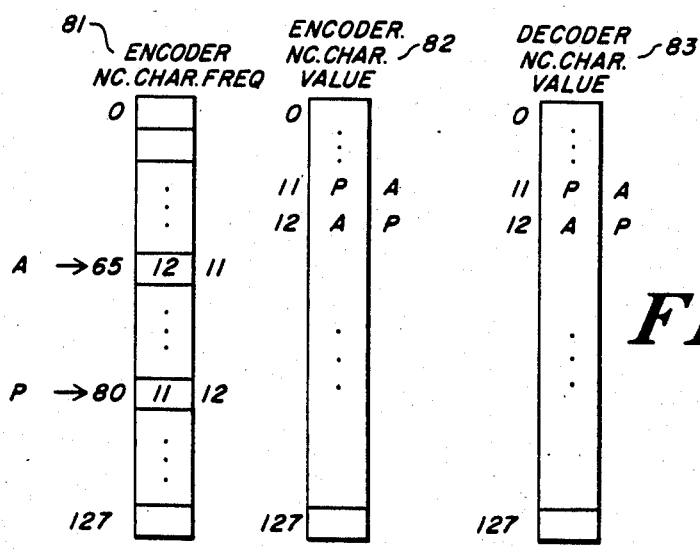
FIG. 8 shows the tables used by the embodiment of FIG. 4 for encoding or decoding of new characters following transmission or receipt of transmission of the position occupied by the new character symbol.

It will be recalled that the first difference set forth above between the simplified explanation and a preferred embodiment is that the particular new character transmitted is not actually transmitted in an unencoded form, and that there is a table that generates a code for such circumstances. FIG. 8 shows the tables used to derive the encoding for transmission of new characters following transmission of the position occupied by the new character symbol. There is provided a table which I call ENCODER.NC.CHAR.FREQ. This table identifies, in ascending order, in accordance with the pertinent ASCII and EBCDIC coding, a value indicative of such character's approximate local frequency of occurrence in the material being encoded. For example if A is represented by the binary equivalent of 65, the position corresponding to such value in the table will store the binary equivalent of 12 if this character occurs with a frequency just below that of 12 other characters (the most frequent character being identified with a frequency number of 0).

A second table used in encoding is identified as item 82, namely ENCODER.NC.CHAR.VALUE, which stores in order of approximate local frequency of occurrence the appropriate ASCII or EBCDIC coding for such character. Thus the binary equivalent of 65 would be stored in numbered position 12 to indicate the letter A in the previous example. These two tables are updated by having the character being transmitted exchange positions with the character just above it in table 82 and causing corresponding changes in table 81. Thus if A is being encoded and the character P occupies the position immediately above A in table 82, A and P would change places in table 82, and position 65 in table 81 would be changed to contain the binary equivalent of 11 and position 80 in the same table would be changed to contain the binary for 12. The character A is itself transmitted at this time by transmitting in accordance with a heretofore undiscussed table, namely ENCODER.NC.ENCODING.TABLE. This table transmits an appropriate binary number to indicate the decimal number 12 and therefore the new character "A". On receipt of this binary information by the corresponding decoding embodiment of the present invention, two tables, namely DE.ZONE.TABLE and DE.DIGIT.TABLE, are used to produce the binary number indicative of a position in the DECODER.NC.CHAR.VALUE table 83, in this case the binary number corresponding to decimal 12. On the receipt by the decoder of this information, it knows to update table 83 by interchanging the position occupied by the ASCII or EBCDIC coding for "A" with that of its predecessor, and does so. In this fashion, because characters are identified by their position in a table indicating approximate local relative frequency of occurrence, the more frequently occurring characters may be encoded using fewer than the usual 7 bits required for identification. This method of compression generally averages approximately 6 bits per character.

The structure of ENCODER.NC.ENCODING.TABLE is important to the effectiveness of the approach used here. As shown in FIG. 9, I have found that it is effective to divide the 128 characters (shown as ordinal numerals 0 through 127) into binary zones, which I identify as 0, 10, 110, and 111. In zone 0, I use 16 4-bit binary digits to differentiate the 16 most frequently occurring characters in accordance with table 82 and 83. In zone 10 the same 16 4-bit digits identify the next 16 most frequently occurring characters according to the foregoing tables, and similarly 5-bit digits are used in zone 110 to identify 32 more characters thereafter the next most frequently occurring, and in zone 111, 6-bit digits are used to identify the remaining 64 characters.

I have found it convenient to use relative position (ordinal numeral) 31 in the ENCODER.NC.CHAR.-VALUE and DECODER.NC.CHAR.VALUE tables to indicate alternatively the presence of a device command, which is not a character per se. The presence of a command is indicated by transmitting a binary "1" after the binary encoding for position 31. Following a binary "1", there is transmitted a string of variable length containing the actual device command. If a binary "0" is transmitted, then no command is present, and normal new character encoding is understood. Device commands can be used in a manner well known in the art to operate indicator lamps, to cause the reset of the devices, to initiate loop back procedures, and to cause other desired control operations.

Referring now to the Appendix, there is a detailed listing of the important processing steps used for encoding and decoding in accordance with a preferred embodiment of the present invention such as illustrated in FIG. 5. (Exhibits 1 and 2 are written in standard Z80 macro assembly language, except that variables and other names in the listing have been expanded for purposes of clarity.) The first portion of the Appendix, lines 00100–10600, identifies variables to be used in the process of encoding and decoding and establishes the tables previously discussed. Beginning at line 10750, tables 81, 82, and 83 of FIG. 8 are initialized by entering in them consecutively binary numbers corresponding to decimal 0–127. This process is completed at line 11300. Lines 11350–11700 provide initial values to certain variables that are used in connection with operation of the embodiment. At lines 11750–12300 the address of the variable FONT.ADDRESS.DUMMY is stored in the two-byte address portion of the FONT.TABLES for each font stored in the FONT.TABLES.

The encoder routine begins at line 12500. A character is fetched from the buffer TREN (where process 51 in accordance with FIG. 5 has loaded input data), in accordance with subroutine ENCODER.FETCH-.FIFO.TREN in a manner well known in the art. Lines 12600–14550 involve testing for repeat encoding. The basic concept is that if the input data involved the repetition of a character, the character is encoded a second time and the second encoded character is sent, but a repeat counter is incremented to keep track of the number of repetitions. On the second and subsequent repetitions, the counter is incremented to a maximum of nine, whereupon a code is sent. A code is also sent earlier if the repetition stops before nine times. The code is as follows: after the transmission of the normal encoding for the first repetition, a 0 is sent to indicate no further repetitions, but if there are repetitions a 1 is transmitted followed by a 3-place binary number which has the total number of repetitions less 2; thus in the case of a character that occurs three consecutive times the coding would be a 1 followed by binary 000.

Following the treatment of the repetition coding, program control at line 14650 deals with the macro called FONT.PARAMETERS. The substance of this macro is in the listing beginning at line 32050 and ending at line 33750. This macro calculates the location of the applicable font in the FONT.ADDRESS.TABLE 62, discussed above in connection with FIG. 6. Assuming that a 0 value is found for the pointer in the calculated location in FONT.ADDRESS.TABLE, there will be no currently active font in the FONT.TABLES, and the font must therefore be made active. Thus the program control will void the jump at 14750 and move on to 14800, which is a routine ending at 15150. The program calls a macro entitled FONT.PARAMS.-NEW, which begins in full at line 33950 and continues through line 35650. The FONT.PARAMS.NEW is used to update the ENCODER.FONT.TABLE and the ENCODER.FONT.ADDRESS.TABLE. The variable NEXT.FONT.ADDRESS identifies the address of the next font table in the ENCODER.-FONT.TABLES that is available to be assigned or reassigned. This address is stored in the appropriate location in the FONT.ADDRESS.TABLE. However, in the case of reassignment of a font table in the FONT.TABLES, there must be identified the old font to which it related; this is done by using the prior two-byte pointer still stored in the font table to identify the pertinent address in the FONT.ADDRESS.TABLE. The memory at the pertinent location in the FONT-.ADDRESS.TABLE is then set to 0 to indicate that the old font is no longer active. Next, the pointer in the newly active font table in the FONT.TABLES is changed to identify the location in the FONT.ADDRESS.TABLE for the newly active font. Finally, the entries in this font table identifying the number of active characters and the position of new character are reset to 0 (indicating the first position), and the variable NEXT.FONT.ADDRESS is incremented by 19 bytes (modulo the maximum number of bytes in the table) to identify the next available table. Control then jumps to a point in the program identified as ENCODER.NEW.-FONT, the body of which begins at line 19250.

In the event that an active font is already present, control goes to line 15200. There the program causes an examination of the pertinent font table to determine whether the character to be encoded is already present in the table. If the character is present, then the program identifies heuristically the position in the table occupied by the character (taking into account the heuristic position of the new character symbol), and causes selection from the appropriate part of the ENCODING.TABLE of the binary coding to identify such position. Also, the position of the selected character in the font table is interchanged with that of the immediately preceding character in the table, and the heuristic position of the new character symbol is appropriately updated if necessary. Finally, the binary coding resulting from the selection in the ENCODER.TABLE is given as an output.

In the event that a character is not present in the pertinent font table, then control passes to line 18700 identified as ENCODER.NEW.CHARACTER. At this point, the heuristic position of the new character symbol is given as an output. Also, the binary coding for the particular character is given as an output in accordance with the table called ENCODER.NC.-CHAR.VALUE discussed above in connection with FIG. 8; this table is itself then updated in the manner discussed in connection with FIG. 8. Thereafter, the font table is updated in precisely the manner as in the case of a new font. In particular, control passes to ENCODER.NEW.FONT, mentioned above. If the number of active characters is less than the maximum, then it is incremented by 1, and in that indicated position is stored the binary code indicative of the character being encoded. If the number of active characters is already at the maximum, in the last position in the font table for this font there is inserted the binary code for the pertinent character, and the old number stored therein is simply overwritten.

After any of the processing steps described above, control passes to ENCODER.RESET.FONT at line 17450, where variables are reset to establish the next font to be processed. In particular, the Types of the three characters most recently processed are updated and the last character is updated. Additional lines of code are included for the special case of EBCDIC, because the use of EBCDIC will affect the determination of the Type code.

In the present embodiment I have also found it desirable to transmit a pattern of 4 zero-bits after 256 iterations of ENCODER.RESET.FONT; if the decoder does not similarly identify these 4 zero-bits after the 256 the iteration of its DECODER.RESET.FONT, then an error condition exists, owing probably to a data communications failure, and this condition is flagged, and processing of data stops. The 4-bit string of zeros is added at lines 18550-18650.

The operation of the decoder follows closely that of the encoder. Refering to line 20650, the decoder utilizes the macro FONT.PARAMETERS, discussed above, to determine whether a currently active font is present or whether there is a new font condition. In the event of a new font, control at line 21150 jumps to DECODER.-PROCESS.NEW.CHARACTER at line 21450. For character processing in the event of an existing active font, control passes to line 21200. After running the macro FONT.PARAM.OLD (which sets the address of the current font), control goes to line 24750, DECODER.PROCESS.OLD.CHARACTER. Here the program uses the macro DECODE.FONT to decode the binary string indicative of a position in the current font. If the position is indicative of the new character symbol, control jumps back to DECODER.PROCESS.NEW.-CHARACTER for new character processing, which will be discussed below. Otherwise, since a character appearing in a given font has occurred, the pertinent font table must be updated (which occurs at lines 25050-26450), and goes into end processing indicated by the routine DECODER.RESET.FONT, at line 26500.

In the case of either a new font or a new character within an existing font, the routine DECODER.-PROCESS.NEW.CHARACTER uses the macro DECODE.CHAR to decode the frequency-encoded new character in accordance with the table DECODER.NC.CHAR.VALUE, as identified in each case by the encoding table shown as FIG. 9, discussed above. If ordinal numeral 31 is indicated by the binary coding shown in FIG. 9, further processing is necessary to determine whether a device command is present. In a case where a binary 1 follows the coding for position 31, program control goes to the routine identified as DECODER.COMMAND.EXTRACT, at line 21750, where the pertinent device command is interpreted. Otherwise, if the coding for ordinal numeral 31 is followed by a binary zero, control passes, as in the normal case, to the routine identified as DECODER.NEW.-CHARACTER, at line 23100. Here, the program's activity is similar to that in the case of a new font in the encoder; if the number of active characters is less than the maximum, the count for that font is incremented by 1, and in that indicated position is stored the binary code indicative of the character being decoded. If the number of active characters is already at maximum, then into the last position in the font table for this font, there is inserted the binary code for the pertinent character, and the old number stored therein is simply overwritten. Control then passes to the routine identified as DECODER.RESET.FONT. The routine DECODER.RESET.FONT causes the pertinent ASCII or EBCIDIC representation of the given character to be decoded as an output at line 26550, and then begins processing analogous to that of the encoder at line 17450, wherein variables are reset to establish the next font to be processed. The Types of the three characters most recently processed are updated, and the last character is updated. Additional lines of code are included for the special case of EBCIDIC, insofar as it will affect the determination of the TYPE code.

Next there is programming to detect, after 256 iterations of DECODER.RESET.FONT, a string of four zero bits, as described above. If the four bit string of zeros is not detected, an error condition exists, and processing of data is halted.

Thereafter, at line 27800, the program tests to determine whether the newly decoded character is the same as the previously decoded character; in the event that the character is different, control returns to the beginning of the decoder routine. Otherwise, there is logic to handle the encoding of repeated characters. This logic is identified as DECODER.REPEAT.LOGIC, running from lines 27950 to 28900. In essence, if a zero bit follows the character just decoded, there are no repetitions, and if a 1 follows, there will follow thereafter three bits indicative of the number of repetitions in the manner discussed above. The number of repetitions is then used to cause the writing of the pertinent number of identical characters to the output.

Referring now to the command routine at line 29400, there is shown the coding that permits the insertion of a device command at any point in the encoded stream, so that the decoder can be given pertinent commands at any time; the device commands are decoded in the manner described above. The macros which follow beginning at line 31950 perform detailed housekeeping functions that have been generally described above in connection with the encoder and decoder.

Although the foregoing is a description of specific embodiments of the invention, it will be appreciated that the invention may be embodied in a variety of forms diverse from those shown and described without departing from the spirit and scope of the invention as defined by the following claims.

APPENDIX

```
00000;************ T A B L E S   A N D   V A R I A B L E S ******************
00050
00100   PARAMETER.CHARS.PER.SET            EQU    128
00150   PARAMETER.CHARS.PER.TABLE          EQU    15
00200   PARAMETER.FONT.POINTERS.PER.CHAR   EQU    16
00250   PARAMETER.TABLES                   EQU    1000
00300   SIZE.OF.POINTERS                   EQU    2
00350   SIZE.OF.TABLES                     EQU    2 + PARAMETER.CHARS.PER.TABLE
00400$$$$$$$$$$$$$$$$$$$$$$$$$$$$$$$$$$$$$$$$$$$ + SIZE.OF.POINTERS
00450
00500   DECODER.NC.CHAR.VALUE:             DS     PARAMETER.CHARS.PER.SET
00550   ENCODER.NC.CHAR.VALUE:             DS     PARAMETER.CHARS.PER.SET
00600   ENCODER.NC.CHAR.FREQ:              DS     PARAMETER.CHARS.PER.SET
00650
00700   DECODER.FONT.ADDRESS.TABLE:        DS     PARAMETER.CHAR.PER.SET
00750$$$$$$$$$$$$$$$$$$$$$$$$$$$$$$$$$$$$$$$$$$ * PARAMETER.FONT.POINTERS.PER.CHAR
00800$$$$$$$$$$$$$$$$$$$$$$$$$$$$$$$$$$$$$$$$$$ * SIZE.OF.POINTERS
00850   DECODER.FONT.ADDRESS.TABLE.END:
00900
00950   ENCODER.FONT.ADDRESS.TABLE:        DS     PARAMETER.CHAR.PER.SET
01000$$$$$$$$$$$$$$$$$$$$$$$$$$$$$$$$$$$$$$$$$$ * PARAMETER.FONT.POINTERS.PER.CHAR
01050$$$$$$$$$$$$$$$$$$$$$$$$$$$$$$$$$$$$$$$$$$ * SIZE.OF.POINTERS
01100   ENCODER.FONT.ADDRESS.TABLE.END:
01150
01200   DECODER.FONT.TABLES:               DS     PARAMETER.TABLES * SIZE.OF.TABLES
01250   DECODER.FONT.TABLES.END:
01300
01350   ENCODER.FONT.TABLES:               DS     PARAMETER.TABLES * SIZE.OF.TABLES
01400   ENCODER.FONT.TABLES.END:
01450
01500   DECODING.BUFFER:                   DB     0
01550   DECODER.CURRENT.CHAR:              DB     0
01600   DECODER.LAST.CHAR:                 DB     0
01650   DECODER.T.1:                       DB     0
01700   DECODER.T.2:                       DB     0
01750   DECODER.T.3:                       DB     0
01800   DECODER.FAIL.SAFE.COUNTER:         DB     0
01850   DECODER.FONT.ENTRY.PTR:            DW     0
01900   DECODER.FP.FROM.SW:                DB     0
01950   DECODER.NEXT.FONT.ADDRESS:         DW     0
02000   ENCODER.CURRENT.CHAR:              DB     0
02050   ENCODING.BUFFER:                   DB     0
02100   ENCODER.LAST.CHAR:                 DB     0
02150   ENCODER.T.1:                       DB     0
02200   ENCODER.T.2:                       DB     0
02250   ENCODER.T.3:                       DB     0
02300   ENCODER.FAIL.SAFE.COUNTER:         DB     0
02350   ENCODER.FONT.ENTRY.PTR:            DW     0
02400   ENCODER.FT.A:                      DB     0
02450   ENCODER.FREQUENCY:                 DB     0
02500   ENCODER.NEXT.FONT.ADDRESS:         DW     0
02550   ENCODER.REPEAT.COUNT:              DB     0
02600   FONT.ADDRESS.DUMMY:                DW     0
02650
02700   ENCODING.TABLE:
02750
02800;          2 ENTRIES:
02850                       DB    11000000B,01000000B
02900                       DB    0,0,0,0,0,0,0,0,0,0,0,0,0,0
02950;         3 ENTRIES:
03000                       DB    11000000B,00100000B,01100000B
03050                       DB    0,0,0,0,0,0,0,0,0,0,0,0,0
03100;         4 ENTRIES:
03150                       DB    11000000B,00100000B,01010000B,01110000B
03200                       DB    0,0,0,0,0,0,0,0,0,0,0,0
03250;         5 ENTRIES:
03300                       DB    11000000B,00100000B,01010000B,01101000B,01111000B
03350                       DB    0,0,0,0,0,0,0,0,0,0,0
```

```
03400;         6 ENTRIES:
03450                    DB      10100000B,11100000B,00010000B,00110000B,01010000B
03500                    DB      01110000B
03550                    DB      0,0,0,0,0,0,0,0,0,0
03600;         7 ENTRIES:
03650                    DB      10100000B,11100000B,00010000B,00110000B,01010000B
03700                    DB      01101000B,01111000B
03750                    DB      0,0,0,0,0,0,0,0,0
03800;         8 ENTRIES:
03850                    DB      10100000B,11100000B,00010000B,00110000B,01001000B
03900                    DB      01011000B,01101000B,01111000B
03950                    DB      0,0,0,0,0,0,0,0
04000;         9 ENTRIES:
04050                    DB      10100000B,11100000B,00010000B,00110000B,01001000B
04100                    DB      01011000B,01101000B,01110100B,01111100B
04150                    DB      0,0,0,0,0,0,0
04200;        10 ENTRIES:
04250                    DB      10100000B,11100000B,00010000B,00110000B,01001000B
04300                    DB      01011000B,01100100B,01101100B,01110100B,01111100B
04350                    DB      0,0,0,0,0,0
04400;        11 ENTRIES:
04450                    DB      10100000B,11100000B,00010000B,00110000B,01001000B
04500                    DB      01011000B,01100100B,01101100B,01110100B,01111010B
04550                    DB      01111110B
04600                    DB      0,0,0,0,0
04650;        12 ENTRIES:
04700                    DB      10100000B,11100000B,00010000B,00110000B,01001000B
04750                    DB      01011000B,01100100B,01101100B,01110010B,01110110B
04800                    DB      01111010B,01111110B
04850                    DB      0,0,0,0
04900;        13 ENTRIES:
04950                    DB      10100000B,11100000B,00010000B,00101000B,00111000B
05000                    DB      01001000B,01010100B,01011100B,01100100B,01101100B
05050                    DB      01110100B,01111010B,01111110B
05100                    DB      0,0,0
05150;        14 ENTRIES:
05200                    DB      10100000B,11100000B,00010000B,00101000B,00111000B
05250                    DB      01001000B,01010100B,01011100B,01100100B,01101100B
05300                    DB      01110010B,01110110B,01111010B,01111110B
05350                    DB      0,0
05400;        15 ENTRIES:
05450                    DB      10100000B,11100000B,00010000B,00101000B,00111000B
05500                    DB      01000100B,01001100B,01010100B,01011100B,01100100B
05550                    DB      01101100B,01110010B,01110110B,01111010B,01111110B
05600                    DB      0
05650;        16 ENTRIES:
05700                    DB      10100000B,11100000B,00010000B,00101000B,00111000B
05750                    DB      01000100B,01001100B,01010100B,01011100B,01100100B
05800                    DB      01101010B,01101110B,01110010B,01110110B,01111010B
05850                    DB      01111110B
05900
05950   NCT0             EQU             1
06000   NCT1             EQU             2
06050   NCT2             EQU             4
06100   NCT3             EQU             8
06150   NCT4             EQU             16
06200   NCT5             EQU             32
06250   NCT6             EQU             64
06300   NCT7             EQU             128
06350
06400   NCC0             EQU             128
06450   NCC1             EQU             64
06500   NCC2             EQU             32
06550   NCC3             EQU             16
06600   NCC4             EQU             8
06650   NCC5             EQU             4
06700   NCC6             EQU             2
06750   NCC7             EQU             1
06800
06850   Z0               DEFL            010100000B
06900   Z10              DEFL            011010000B
06950   Z110             DEFL            011101000B
```

```
07000  Z111              DEFL        011111000B
07050
07100  BUILD.NC.CODES    MACRO       ZONE,BITS
07150  NC.ZONE           DEFL        Z&ZONE
07200                    REPT        8
07250  NC.ZONE           ! DEFL      NC.ZONE+NC.ZONE
07300                    ! IFT       0100H EQ (NC.ZONE AND 0100H)
07350                    ! ! EXITM
07400                    ! ENDIF
07450                    ENDM
07500  NC.ZONE           DEFL        NC.ZONE AND 0FFH
07550  NC.DIGIT          DEFL        NCC&BITS
07600                    REPT        NCT&BITS
07650                    ! DB        NC.ZONE,NC.DIGIT
07700  NC.DIGIT          ! DEFL      NC.DIGIT+NCC&BITS+NCC&BITS
07750                    ENDM
07800                    ENDM
07850
07900  ENCODER.NC.ENCODING.TABLE:
07950                    BUILD.NC.CODES   0,4
08000                    BUILD.NC.CODES   10,4
08050                    BUILD.NC.CODES   110,5
08100                    BUILD.NC.CODES   111,6
08150
08200  DE.DIGIT.TABLE:
08250                    DB          0,16,32,64
08300
08350  DE.ZONE.TABLE:
08400                    DB          040H,001H,041H,001H,052H,063H
08450
08500  DE.FONT.TABLE.INDEX:
08550                    DB          000,002,006,012
08600                    DB          020,030,042,056
08650                    DB          072,090,110,132
08700                    DB          156,182,210
08750
08800. DE.FONT.TABLE:
08850                    DB          010H,000H
08900                    DB          002H,000H,010H,020H
08950                    DB          002H,000H,010H,001H,020H,030H
09000                    DB          002H,000H,010H,001H,020H,001H,030H,040H
09050                    DB          004H,001H,000H,010H,002H,003H,020H,030H
09100                    DB          040H,050H
09150                    DB          004H,001H,000H,010H,002H,003H,020H,030H
09200                    DB          040H,001H,050H,060H
09250                    DB          004H,001H,000H,010H,002H,003H,020H,030H
09300                    DB          002H,003H,040H,050H,060H,070H
09350                    DB          004H,001H,000H,010H,002H,003H,020H,030H
09400                    DB          002H,003H,040H,050H,060H,001H,070H,080H
09450                    DB          004H,001H,000H,010H,002H,003H,020H,030H
09500                    DB          002H,003H,040H,050H,002H,003H,060H,070H
09550                    DB          080H,090H
09600                    DB          004H,001H,000H,010H,002H,003H,020H,030H
09650                    DB          002H,003H,040H,050H,002H,003H,060H,070H
09700                    DB          080H,001H,090H,0A0H
09750                    DB          004H,001H,000H,010H,002H,003H,020H,030H
09800                    DB          002H,003H,040H,050H,002H,003H,060H,070H
09850                    DB          002H,003H,080H,090H,0A0H,0B0H
09900                    DB          004H,001H,000H,010H,002H,003H,020H,003H
09950                    DB          004H,005H,030H,040H,050H,003H,004H,005H
10000                    DB          060H,070H,080H,090H,0A0H,001H,0B0H,0C0H
10050                    DB          004H,001H,000H,010H,002H,003H,020H,003H
10100                    DB          004H,005H,030H,040H,050H,003H,004H,005H
10150                    DB          060H,070H,080H,090H,002H,003H,0A0H,0B0H
10200                    DB          0C0H,0D0H
10250                    DB          004H,001H,000H,010H,002H,003H,020H,003H
10300                    DB          004H,005H,030H,040H,004H,005H,006H,007H
10350                    DB          050H,060H,070H,080H,090H,0A0H,002H,003H
10400                    DB          0B0H,0C0H,0D0H,0E0H
10450                    DB          004H,001H,000H,010H,002H,003H,020H,003H
10500                    DB          004H,005H,030H,040H,004H,005H,006H,007H
10550                    DB          050H,060H,070H,080H,090H,003H,004H,005H
10600                    DB          0A0H,0B0H,0C0H,0D0H,0E0H,0F0H
```

```
10650;**************** I N I T I A L I Z E    T A B L E S ******************
10700
10750    INITIALIZE.TABLES:
10800              LD              B,3
10850              LD              HL,DECODER.NC.CHAR.VALUE
10900    SET.NC.CHAR.FREQ.AND.VALUE:
10950              XOR             A
11000    SET.NC.CHAR.FREQ.AND.VALUE.LOOP:
11050              LD              (HL),A
11100              INC             HL
11150              INC             A
11200              CP              PARAMETER.CHARS.PER.SET
11250              JR              NZ,SET.NC.CHAR.FREQ.AND.VALUE.LOOP
11300              DJNZ            SET.NC.CHAR.FREQ.AND.VALUE
11350              LD              A,080H
11400              LD              (ENCODING.BUFFER),A
11450              LD              A,001H
11500              LD              (DECODING.BUFFER),A
11550              LD              HL,DECODER.FONT.TABLES
11600              LD              (DECODER.NEXT.FONT.ADDRESS),HL
11650              LD              HL,ENCODER.FONT.TABLES
11700              LD              (ENCODER.NEXT.FONT.ADDRESS),HL
11750              LD              DE,SIZE.OF.TABLES-1
11800              LD              BC,ENCODER.FONT.TABLES.END
11850              LD              HL,DECODER.FONT.TABLES
11900    SET.FONT.ADDRESS.DUMMY:
11950              LD              (HL),HIGH(FONT.ADDRESS.DUMMY)
12000              INC             HL
12050              LD              (HL),LOW(FONT.ADDRESS.DUMMY)
12100              ADD             HL,DE
12150              SBC             HL,BC
12200              JR              Z,DECODER.FONT.PARAMETERS
12250              ADD             HL,BC
12300              JP              SET.FONT.ADDRESS.DUMMY
12350;**************** E N C O D E R    R O U T I N E ********************
12400
12450    ENCODER.FETCH.A.CHARACTER:
12500              CALL            ENCODER.FETCH.FIFO.TREN
12550    ENCODER.SAVE.CURRENT.CHAR:
12600              LD              A,B
12650              LD              (ENCODER.CURRENT.CHAR),A
12700              LD              A,(ENCODER.LAST.CHAR)
12750              LD              HL,ENCODER.REPEAT.COUNT
12800              CP              B                       ; IF CURRENT.CHAR =
12850              JP              NZ,ENCODER.CHARACTER.CHANGE
12900              LD              A,010H                  ; LAST.CHAR, ADD 1 TO
12950              ADD             A,(HL)                  ; REPEAT.COUNT; 1ST
13000              LD              (HL),A                  ; REPEAT GOES TO
13050              CP              010H                    ; FONT.PARAMETERS,NTH
13100              JP              Z,ENCODER.FONT.PARAMETERS
13150              CP              090H                    ; REPEAT TO FETCH,
13200              JP              NZ,ENCODER.FETCH.A.CHARACTER
13250    ENCODE.REPEATS.MAX.COUNT:                         ; UNTIL MAX REPEATS
13300              LD              (HL),0                  ; OF 9 HAVE BEEN
13350              SUB             020H                    ; PROCESSED, THEN
13400              SET             7,A                     ; ENCODE REPEAT.COUNT
13450              SET             3,A                     ; AFTER ADJUSTING
13500              LD              C,A                     ; BY -2
13550              ENCODE.VARIABLE.FIELD       ERM,B
13600              JP              ENCODER.FETCH.A.CHARACTER
13650    ENCODER.CHARACTER.CHANGE:
13700              LD              A,(HL)                  ; IF NOT EQUAL, TEST
13750              CP              0                       ; REPEAT.COUNT = 0
13800              JP              Z,ENCODER.FONT.PARAMETERS
13850              LD              (HL),0                  ; IF REPEAT.COUNT = 1
13900              CP              010H                    ; SEND 0 BIT
13950              JP              Z,ENCODER.ENCODE.ZERO
14000    ENCODER.ENCODE.REPEATS.NEW.CHARACTER:
14050              SUB             020H                    ; IF REPEAT.COUNT > 1
14100              SET             7,A                     ; ENCODE REPEAT.COUNT
14150              SET             3,A                     ; AFTER ADJUSTING
14200              LD              C,A                     ; BY -2
```

```
14250                 ENCODE.VARIABLE.FIELD         EER,B
14300            JP         ENCODER.FONT.PARAMETERS
14350   ENCODER.ENCODE.ZERO:
14400            XOR        A                     ; ENCODE O BIT
14450            SET        6,A
14500            LD         C,A
14550                 ENCODE.VARIABLE.FIELD         EEZ,B
14600   ENCODER.FONT.PARAMETERS:
14650            FONT.PARAMETERS ENCODER.LAST.CHAR
14700$$$$$$$$$$$$$$$$$$$$$$$$$$$$$$$ ,ENCODER.FONT.ADDRESS.TABLE
14750            JP         NZ,ENCODER.FONT.PARAMS.OLD
14800   ENCODER.FONT.PARAMS.NEW:
14850            FONT.PARAMS.NEW EN,ENCODER.NEXT.FONT.ADDRESS
14900$$$$$$$$$$$$$$$$$$$$$$$$$$$$$$$$ ,ENCODER.FONT.TABLES
14950$$$$$$$$$$$$$$$$$$$$$$$$$$$$$$$$ ,ENCODER.FONT.TABLES.END
15000            JP         NZ,ENCODER.NEW.FONT
15050            LD         HL,ENCODER.FONT.TABLES       ; RESET TO START
15100            LD         (ENCODER.NEXT.FONT.ADDRESS),HL; OF FONT.TABLES
15150            JP         ENCODER.NEW.FONT
15200   ENCODER.FONT.PARAMS.OLD:
15250            FONT.PARAMS.OLD ENCODER.FONT.TABLES
15300            LD         B,0                  ; SET BC = FT.ACTIVE
15350            LD         C,D                  ; (> 0); SET HL TO
15400            INC        HL                   ; 1ST CHARACTER
15450            LD         A,(ENCODER.CURRENT.CHAR)
15500            CPIR                            ; LOOKUP CURRENT.CHAR
15550            JP         NZ,ENCODER.NEW.CHARACTER
15600   ENCODER.OLD.CHARACTER:                   ; SET A = (D - C)
15650            LD         A,D                  ; (CHARACTER INDEX)
15700            SUB        C
15750            LD         C,A                  ; SET C = FT.C;
15800            LD         B,E                  ; IF FT.NC > OR =
15850            INC        B                    ; FT.C, THEN FT.A =
15900            CP         B                    ; FT.C - 1; ELSE
15950            JP         P,ENCODER.OLD.CHAR.SET.FT.A
16000            DEC        A                    ; FT.A = FT.C
16050   ENCODER.OLD.CHAR.SET.FT.A:
16100            POP        HL                   ; FONT TABLE + 3
16150            CP         0                    ; SAVE FT.A AND SKIP
16200            JP         Z,ENCODER.OLD.CHAR.WRITE.1
16250            LD         (ENCODER.FT.A),A     ; FREQ STUFF IF = 0;
16300            DEC        A                    ; IF FT.A - 1 = FT.NC
16350            CP         E                    ; INCREMENT FT.NC
16400            JR         NZ,ENCODER.OLD.CHAR.SWAP
16450            INC        E                    ; STORE NEW FT.NC
16500            LD         (HL),E               ; IN FONT TABLE
16550            JP         ENCODER.OLD.CHAR.WRITE
16600   ENCODER.OLD.CHAR.SWAP:
16650            LD         B,0
16700            ADD        HL,BC                ; SET BC = (FONT.
16750            LD         B,H                  ; ENTRY.PTR + 1)
16800            LD         C,L                  ; + FT.C - 1
16850            DEC        BC
16900            LD         A,(BC)
16950            LD         E,A                  ; (HL) IS THE CURRENT
17000            LD         A,(HL)               ; CHARACTER
17050            LD         (BC),A
17100            LD         (HL),E               ; SWAP (BC) & (HL)
17150   ENCODER.OLD.CHAR.WRITE:
17200            LD         A,(ENCODER.FT.A)     ; SET B = FT.A
17250   ENCODER.OLD.CHAR.WRITE.1:                ;     D = FT.ACTIVE
17300            LD         B,A
17350            WRITE.ENCODED.FONT              EOC
17400            LD         A,(ENCODER.CURRENT.CHAR)
17450   ENCODER.RESET.FONT:
17500;           (A = CURRENT.CHAR)              ; UPDATE LAST.CHAR,
17550            LD         E,A                  ; T.1, T.2 & T.3
17600            LD         (ENCODER.LAST.CHAR),A;FOR NEXT CHARACTER
17650            LD         A,(ENCODER.T.2)      ; ENCODING
17700            LD         (ENCODER.T.1),A
17750            LD         A,(ENCODER.T.3)
17800            LD         (ENCODER.T.2),A
```

```
17850           LD              A,(VARIANT.TERMINAL.WORD.TYPE)
17900           BIT             1,A                 ; T.3 IS SET TO THE
17950           LD              A,E                 ; CHARACTER TYPE FOR
18000           JR              NZ,ENCODER.CHAR.EBCDIC; THE NEWLY SET
18050           RLCA                                ; LAST CHARACTER
18100 ENCODER.CHAR.EBCDIC:
18150           AND             0C0H
18200           RLCA                                ; RETURN TO FETCH
18250           RLCA                                ; NEXT CHARACTER
18300           LD              (ENCODER.T.3),A
18350           LD              A,(ENCODER.FAIL.SAFE.COUNTER)
18400           ADD             A,1
18450           LD              (ENCODER.FAIL.SAFE.COUNTER),A
18500           JP              NC,ENCODER.FETCH.A.CHARACTER
18550           LD              C,008H
18600           ENCODE.VARIABLE.FIELD       ECE,B
18650           JP              ENCODER.FETCH.A.CHARACTER
18700 ENCODER.NEW.CHARACTER:
18750           LD              B,E                 ; B = FT.NC = FT.A
18800           WRITE.ENCODED.FONT          ENC
18850           POP             HL                  ; FONT TABLE + 3;
18900           XOR             A                   ; IF FT.NC NOT = 0,
18950           ADD             A,(HL)              ; UPDATE FT.NC TO
19000           JR              Z,ENCODER.NEW.CHAR.PUSH.HL
19050           DEC             A                   ; (FT.NC - 1) AND
19100           LD              (HL),A              ; STORE IN THE FONT
19150 ENCODER.NEW.CHAR.PUSH.HL:                     ; TABLE FT.NC
19200           PUSH            HL
19250 ENCODER.NEW.FONT:                             ; ENCODE NEW CHARACTR
19300           WRITE.ENCODED.CHAR          ENF
19350           POP             HL                  ; FONT TABLE + 3;
19400           DEC             HL                  ; IF FT.ACTIVE AT MAX
19450           LD              A,(HL)              ; JUMP TO TABLE.FULL
19500           CP              PARAMETER.CHARS.PER.TABLE
19550           JP              Z,ENCODER.NEW.CHAR.TABLE.FULL
19600 ENCODER.NEW.CHAR.TABLE.NOT.FULL:
19650           INC             A                   ; INCREMENT FT.ACTIVE
19700           LD              (HL),A              ; & STORE IN FONT
19750           LD              B,0                 ; TABLE
19800           LD              C,A
19850           ADD             HL,BC               ; MOVE CURRENT
19900           INC             HL                  ; CHARACTER TO
19950           LD              A,(ENCODER.CURRENT.CHAR)
20000           LD              (HL),A              ; FONT TABLE
20050           JP              ENCODER.RESET.FONT
20100 ENCODER.NEW.CHAR.TABLE.FULL:
20150           LD              B,0                 ; MOVE CHARACTER
20200           LD              C,PARAMETER.CHARS.PER.TABLE
20250           ADD             HL,BC               ; TO END OF
20300           INC             HL                  ; FONT TABLE
20350           LD              A,(ENCODER.CURRENT.CHAR)
20400           LD              (HL),A
20450           JP              ENCODER.RESET.FONT
20500;**************** D E C O D E R   R O U T I N E ***********************
20550
20600 DECODER.FONT.PARAMETERS:
20650           FONT.PARAMETERS DECODER.LAST.CHAR
20700$$$$$$$$$$$$$$$$$$$$$$$$$$$$$$ ,DECODER.FONT.ADDRESS.TABLE
20750           JP              NZ,DECODER.FONT.PARAMS.OLD
20800 DECODER.FONT.PARAMS.NEW:
20850           FONT.PARAMS.NEW DE,DECODER.NEXT.FONT.ADDRESS
20900$$$$$$$$$$$$$$$$$$$$$$$$$$$$$$ ,DECODER.FONT.TABLES
20950$$$$$$$$$$$$$$$$$$$$$$$$$$$$$$$$$ ,DECODER.FONT.TABLES.END
21000           JP      NZ,DECODER.PROCESS.NEW.CHARACTER
21050           LD      HL,DECODER.FONT.TABLES        ; RESET TO START
21100           LD      (DECODER.NEXT.FONT.ADDRESS),HL; OF FONT.TABLES
21150           JP      DECODER.PROCESS.NEW.CHARACTER
21200 DECODER.FONT.PARAMS.OLD:
21250           FONT.PARAMS.OLD DECODER.FONT.TABLES
21300           LD              A,1                 ; SET FP.FROM.SW = 1
21350           LD              (DECODER.FP.FROM.SW),A
21400           JP              DECODER.PROCESS.OLD.CHARACTER
```

```
21450   DECODER.PROCESS.NEW.CHARACTER:
21500                   PUSH            DE
21550                   DECODE.CHAR     PNC
21600ssssssssssssssssssssssssssssssss   ,DECODER.COMMAND.IDLE
21650ssssssssssssssssssssssssssssssss   ,DECODER.COMMAND.EXTRACT
21700ssssssssssssssssssssssssssssssss   ,DECODER.NEW.CHARACTER
21750   DECODER.COMMAND.EXTRACT:
21800                   DEC             B
21850                   SHIFT           B,LEFT
21900                   LD              C,B
21950                   LD              B,0
22000                   LD              HL,DECODER.COMMAND.EXTRACT.JUMP.TABLE
22050                   ADD             HL,BC
22100                   JP              (HL)
22150   DECODER.COMMAND.EXTRACT.JUMP.TABLE:
22200                   JR              DECODER.COMMAND.REPLY.LOOPBACK
22250                   JR              DECODER.COMMAND.REPLY.DISPLAY
22300                   JR              DECODER.COMMAND.STATE.LOOPBACK
22350                   JR              DECODER.COMMAND.STATE.DISPLAY
22400   DECODER.COMMAND.IDLE:
22450                   LD              A,(DECODING.BUFFER)
22500                   LD              B,A
22550                   LD              C,1
22600                   DECODE.FIXED    CIW
22650                   LD              A,B
22700                   OR              A
22750                   JP              Z,DECODER.COMMAND.IDLE
22800   DECODER.COMMAND.END:
22850                   POP             DE
22900                   LD              A,(DECODER.FP.FROM.SW)
22950                   OR              A
23000                   JP              Z,DECODER.PROCESS.NEW.CHARACTER
23050                   JP              DECODER.PROCESS.OLD.CHARACTER
23100   DECODER.NEW.CHARACTER:
23150                   POP             DE
23200                   POP             HL
23250                   XOR             A                       ; FT.ACTIVE = 0 ONLY
23300                   CP              D                       ; IF A BRAND NEW FONT
23350                   JR              Z,DECODER.NEW.FONT
23400                   ADD             A,E                     ; IF FT.NC NOT = 0,
23450                   JR              Z,DECODER.NEW.FONT      ; UPDATE FT.NC TO
23500                   DEC             A                       ; (FT.NC - 1)
23550                   LD              (HL),A
23600   DECODER.NEW.FONT:
23650                   DEC             HL                      ; IF FT.ACTIVE AT MAX
23700                   LD              A,D                     ; JUMP TO TABLE.FULL
23750                   CP              PARAMETER.CHARS.PER.TABLE
23800                   JP              Z,DECODER.NEW.CHAR.TABLE.FULL
23850   DECODER.NEW.CHAR.TABLE.NOT.FULL:
23900                   INC             A                       ; INCREMENT FT.ACTIVE
23950                   LD              (HL),A                  ; & STORE IN FONT
24000                   LD              B,0                     ; TABLE
24050                   LD              C,A
24100                   ADD             HL,BC                   ; MOVE CURRENT
24150                   INC             HL                      ; CHARACTER TO
24200                   LD              A,(DECODER.CURRENT.CHAR)
24250                   LD              (HL),A                  ; FONT TABLE
24300                   JP              DECODER.RESET.FONT
24350   DECODER.NEW.CHAR.TABLE.FULL:
24400                   LD              B,0                     ; MOVE CHARACTER
24450                   LD              C,PARAMETER.CHARS.PER.TABLE
24500                   ADD             HL,BC                   ; TO END OF THE
24550                   INC             HL                      ; FONT TABLE
24600                   LD              A,(DECODER.CURRENT.CHAR)
24650                   LD              (HL),A
24700                   JP              DECODER.RESET.FONT
24750   DECODER.PROCESS.OLD.CHARACTER:
24800                   PUSH            DE
24850                   DECODE.FONT     POC
24900                   POP             DE                      ; IF FT.A = FT.NC,
24950                   CP              E                       ; DO NEW CHARACTER
25000                   JP              Z,DECODER.PROCESS.NEW.CHARACTER
```

APPENDIX

```
25050                       LD              C,A                     ; SET C,D TO FT.A
25100                       LD              D,A
25150                       JP              P,DECODER.OLD.CHAR.SET.FT.C
25200                       INC             C                       ; INCREMENT FT.C
25250   DECODER.OLD.CHAR.SET.FT.C:
25300                       LD              B,0
25350                       POP             HL                      ; MOVE SELECTED FONT
25400                       ADD             HL,BC                   ; CHARACTER TO
25450                       LD              A,(HL)                  ; CURRENT.CHAR
25500                       LD              (DECODER.CURRENT.CHAR),A
25550                       XOR             A                       ; (NO FREQUENCY
25600                       ADD             A,D                     ;  SWAPPING NEEDED)
25650                       JP              Z,DECODER.RESET.FONT
25700                       DEC             A                       ; IF FT.A - 1 = FT.NC
25750                       CP              E                       ; INCREMENT FT.NC
25800                       JP              NZ,DECODER.OLD.CHAR.SWAP
25850                       INC             E                       ; STORE NEW FT.NC
25900                       SBC             HL,BC                   ; VALUE IN THE
25950                       LD              (HL),E                  ; FONT TABLE
26000                       JP              DECODER.RESET.FONT
26050   DECODER.OLD.CHAR.SWAP:
26100                       LD              B,H                     ; SET BC = (FONT.
26150                       LD              C,L                     ; ENTRY.PTR + 1)
26200                       DEC             BC                      ; + FT.C - 1
26250                       LD              A,(BC)
26300                       LD              D,A                     ; (HL) IS THE CURRENT
26350                       LD              A,(HL)                  ; CHARACTER
26400                       LD              (BC),A
26450                       LD              (HL),D                  ; SWAP (BC) & (HL)
26500   DECODER.RESET.FONT:
26550                       WRITE.DECODED.CHAR RSF
26600                       LD              A,(DECODER.FAIL.SAFE.COUNTER)
26650                       ADD             A,1
26700                       LD              (DECODER.FAIL.SAFE.COUNTER),A
26750                       JP              C,DECODER.FAIL.SAFE.COUNTER.OVERFLOW
26800   DECODER.RESET.FONT.CONTINUE:
26850                       LD              HL,DECODER.CURRENT.CHAR
26900                       LD              E,(HL)                  ; SET E = CURRENT &
26950                       INC             HL                      ;     C = LAST.CHAR
27000                       LD              C,(HL)                  ; & RESET LAST.CHAR
27050                       LD              (HL),E
27100                       LD              A,(DECODER.T.2)
27150                       LD              (DECODER.T.1),A         ; UPDATE T.1,T.2,T.3
27200                       LD              A,(DECODER.T.3)
27250                       LD              (DECODER.T.2),A
27300                       LD              A,(VARIANT.TERMINAL.WORD.TYPE)
27350                       BIT             1,A                     ; T.3 IS SET TO THE
27400                       LD              A,E                     ; CHARACTER TYPE FOR
27450                       JR              NZ,DECODER.CHAR.EBCDIC  ; THE NEWLY SET
27500                       RLCA                                    ; LAST CHARACTER
27550   DECODER.CHAR.EBCDIC:
27600                       AND             0C0H
27650                       RLCA
27700                       RLCA
27750                       LD              (DECODER.T.3),A         ; RETURN TO FP IF
27800                       LD              A,E                     ; CURRENT.CHAR NOT
27850                       CP              C                       ; = LAST.CHAR
27900                       JP              NZ,DECODER.FONT.PARAMETERS
27950   DECODER.REPEAT.LOGIC:
28000                       LD              A,(DECODING.BUFFER)
28050                       LD              B,A                     ; IF NEXT BIT = 0,
28100                       LD              C,1                     ; RETURN TO FP
28150                       DECODE.FIXED    RL1
28200                       XOR             A                       ; IF NEXT BIT = 1,
28250                       CP              B                       ; NEXT 3 BITS ARE
28300                       JP              Z,DECODER.FONT.PARAMETERS
28350                       LD              A,(DECODING.BUFFER)     ; THE NUMBER OF
28400                       LD              B,A                     ; REPEATS TO BE
```

```
28450                    LD             C,3                   ; WRITTEN (MOD 0)
28500                    DECODE.FIXED   RL2
28550                    INC            B
28600  DECODER.REPEAT.WRITE:
28650                    PUSH           BC
28700                    WRITE.DECODED.CHAR                   RPW; WRITE CURRENT.CHAR
28750                    POP            BC                    ; N TIMES
28800                    DEC            B
28850                    JP             NZ,DECODER.REPEAT.WRITE
28900                    JP             DECODER.FONT.PARAMETERS
28950  DECODER.FAIL.SAFE.COUNTER.OVERFLOW:
29000                    LD             A,(DECODING.BUFFER)   ; AFTER EVERY 256TH
29050                    LD             B,A                   ; PASS THRU RESET.
29100                    LD             C,4                   ; FONT, THERE SHOULD
29150                    DECODE.FIXED   DRF                   ; BE A PATTERN OF
29200                    XOR            A                     ; FOUR ENCODED 0
29250                    CP             B                     ; BITS, ELSE TILT
29300                    JP             Z,DECODER.RESET.FONT.CONTINUE
29350                    JP             DISPLAY.ERROR.AND.SOFT.RESET
29400;**************** C O M M A N D   R O U T I N E ********************
29450
29500  ENCODER.COMMAND.OUTPUT:
29550                    PUSH           BC
29600                    LD             HL,ENCODER.REPEAT.COUNT
29650                    LD             A,(HL)                ; TEST TO SEE IF
29700                    CP             0                     ; REPEAT.COUNT = 0
29750                    JP             Z,ENCODER.COMMAND.CONTINUE
29800                    LD             (HL),0                ; IF REPEAT.COUNT = 1
29850                    CP             010H                  ; SEND 0 BIT
29900                    JP             Z,ENCODER.COMMAND.ZERO
29950  ENCODER.COMMAND.NEW.CHARACTER:
30000                    SUB            020H                  ; IF REPEAT.COUNT > 1
30050                    SET            7,A                   ; ENCODE REPEAT.COUNT
30100                    SET            3,A                   ; AFTER ADJUSTING
30150                    LD             C,A                   ; BY -2
30200                    ENCODE.VARIABLE.FIELD                ECN,B
30250                    JP             ENCODER.COMMAND.CONTINUE
30300  ENCODER.COMMAND.ZERO:
30350                    XOR            A                     ; ENCODE 0 BIT
30400                    SET            6,A
30450                    LD             C,A
30500                    ENCODE.VARIABLE.FIELD                ECZ,B
30550  ENCODER.COMMAND.CONTINUE:
30600                    FONT.PARAMETERS ENCODER.LAST.CHAR
30650$$$$$$$$$$$$$$$$$$$$$$$$$$$$$ ,ENCODER.FONT.ADDRESS.TABLE,CC
30700                    JP             Z,ENCODER.COMMAND.WRITE.COMMAND
30750  ENCODER.COMMAND.WRITE.NC:
30800                    FONT.PARAMS.OLD ENCODER.FONT.TABLES,CC
30850                    LD             D,(HL)
30900                    INC            HL
30950                    LD             B,(HL)
31000                    WRITE.ENCODED.FONT                   ECW
31050  ENCODER.COMMAND.WRITE.COMMAND:
31100                    LD             C,0BAH
31150                    ENCODE.VARIABLE.FIELD                EC1,B
31200                    POP            BC
31250                    XOR            A
31300                    CP             C
31350                    JR             NZ,ENCODER.COMMAND.WRITE.NOT.IDLE
31400                    LD             C,0B0H
31450                    JP             ENCODER.COMMAND.WRITE.COMMON
31500  ENCODER.COMMAND.WRITE.NOT.IDLE:
31550                    SLA            C
31600                    SLA            C
31650                    SET            7,C
31700                    SET            6,C
31750                    SET            1,C
31800  ENCODER.COMMAND.WRITE.COMMON:
31850                    ENCODE.VARIABLE.FIELD                EC2,B
31900                    RET
```

```
31950;************** F O N T   P A R A M E T E R   M A C R O S **************
32000
32050    FONT.PARAMETERS MACRO       LAST.CHAR,FONT.ADDRESS.TABLE,TYPE
32100
32150               LD          HL,LAST.CHAR
32200               LD          B,(HL)              ; SET B = LAST.CHAR
32250               RES         7,B                 ; AND RESET BIT 7
32300               INC         HL
32350               LD          C,(HL)              ; SET C = T.1
32400               INC         HL
32450               LD          A,(HL)              ; SET A = FONT =
32500               RLCA                            ; (T.2 * 4) + T.1
32550               RLCA
32600               ADD         A,C
32650               ADD         A,A
32700               LD          D,O                 ; SET DE =
32750               LD          E,A                 ; (FONT * 2)
32800               LD          H,D
32850               LD          L,B                 ; SET HL =
32900               ADD         HL,HL               ; (LAST.CHAR * 32)
32950               ADD         HL,HL
33000               ADD         HL,HL
33050               ADD         HL,HL               ; CREATE FINAL
33100               ADD         HL,HL               ; FONT.ADDRESS.TABLE
33150               ADD         HL,DE               ; ADDRESS VALUE
33200               LD          DE,FONT.ADDRESS.TABLE
33250               ADD         HL,DE
33300               ! IFT       "&TYPE" NE "CC"
33350                  LD       D,H                 ; SAVE ADDRESS IN DE
33400                  LD       E,L
33450               ! ENDIF
33500               LD          B,(HL)              ; SET BC =
33550               INC         HL                  ; FONT.TABLES
33600               LD          C,(HL)              ; ADDRESS AND
33650               LD          A,B                 ; TEST IF ADDRESS
33700               OR          C                   ; IS = 0
33750               ENDM
33800
33850;***************************************************************
33900
33950    FONT.PARAMS.NEW MACRO       DOE,NEXT.FONT.ADDRESS
34000ssssssssssssssssssssssssssssss ,FONT.TABLES,FONT.TABLES.END
34050
34100               LD          HL,(NEXT.FONT.ADDRESS)
34150               LD          A,H                 ; STORE THE NEXT FONT
34200               LD          (DE),A              ; TABLE ADDRESS IN
34250               INC         DE                  ; FONT.ADDRESS.TABLE
34300               LD          A,L                 ; AND RESTORE DE
34350               LD          (DE),A              ; FOR LATER USE
34400               DEC         DE
34450               LD          B,(HL)              ; SAVE PRIOR FONT
34500               LD          (HL),D              ; FONT.ADDRESS.TABLE
34550               INC         HL                  ; POINTER IN BC AND
34600               LD          C,(HL)              ; RESET THE POINTER
34650               LD          (HL),E
34700               XOR         A                   ; RESET FT.ACTIVE &
34750               INC         HL                  ; FT.NC TO 0
34800               LD          (HL),A
34850               INC         HL                  ; SAVE FONT TABLE
34900               LD          (HL),A              ; ADDRESS + 3
34950               PUSH        BC
35000               LD          (BC),A              ; 0 OUT PRIOR FONT
35050               INC         BC                  ; FONT.ADDRESS.TABLE
35100               LD          (BC),A              ; POINTER; ADVANCE HL
35150               LD          DE,SIZE.OF.TABLES-3 ; TO NEXT FONT; RESET
35200               ADD         HL,DE               ; NEXT.FONT.ADRRESS
35250               LD          (NEXT.FONT.ADDRESS),HL
35300               LD          DE,FONT.TABLES.END
35350               SBC         HL,DE
35400               ! IFT       "&DOE" EQ "DE"
35450                  LD       D,A                 ; SET D = FT.ACTIVE
```

```
35500                       LD              E,A                     ;       E = FT.NC
35550                       LD              (DECODER.FP.FROM.SW),A; FP.FROM.SW = 0
35600               ! ENDIF
35650                       ENDM
35700
35750;************************************************************
35800
35850   FONT.PARAMS.OLD MACRO               FONT.TABLES,TYPE
35900
35950                       LD              H,B                     ; SET HL = FONT
36000                       LD              L,C                     ; TABLE ADDRESS;
36050                       INC             HL                      ; ADVANCE HL TO POINT
36100                       INC             HL                      ; TO FT.ACTIVE
36150               ! IFT                   "&TYPE" NE "CC"
36200                       LD              D,(HL)                  ; SET D = FT.ACTIVE
36250                       INC             HL                      ;       = FT.NC
36300                       LD              E,(HL)                  ; SAVE FONT TABLE
36350                       PUSH            HL                      ; ADDRESS + 3
36400               ! ENDIF
36450                       ENDM
36500;*************** E N C O D E R   M A C R O S ***************
36550
36600   WRITE.ENCODED.CHAR                  MACRO           PFX
36650
36700; AT START; A = CHARACTER (7 OR 8-BIT)
36750
36800                       LD              A,(ENCODER.CURRENT.CHAR)
36850                       RES             7,A
36900                       LD              B,0                     ; SAVE NEW CHARACTER
36950                       LD              C,A                     ; VALUE IN C;
37000                       LD              D,0                     ; SET B = FREQUENCY
37050                       LD              HL,ENCODER.NC.CHAR.FREQ
37100                       ADD             HL,BC                   ; OF NEW CHARACTER
37150                       LD              B,(HL)
37200                       LD              A,B                     ; SAVE FREQUENCY
37250                       LD              (ENCODER.FREQUENCY),A
37300                       OR              A                       ; IF FREQUENCY = 0,
37350                       JP              Z,PFX&WNU               ; NO UPDATING NEEDED
37400   PFX&WUP:
37450                       DEC             B                       ; DECREMENT FREQUENCY
37500                       LD              (HL),B                  ; AND RESTORE;
37550                       LD              E,B                     ; SET E = CHARACTER
37600                       LD              HL,ENCODER.NC.CHAR.VALUE
37650                       ADD             HL,DE                   ; VALUE AT LOWER
37700                       LD              E,(HL)                  ; FREQUENCY; STORE
37750                       LD              (HL),C                  ; NEW CHARACTER IN
37800                       INC             HL                      ; ITS PLACE; STORE
37850                       LD              (HL),E                  ; OTHER CHARACTER AT
37900                       LD              HL,ENCODER.NC.CHAR.FREQ
37950                       ADD             HL,DE                   ; HIGHER FREQUENCY;
38000                       INC             B                       ; ADD 1 TO FREQUENCY
38050                       LD              (HL),B                  ; OF OTHER CHARACTER
38100   PFX&WNU:
38150                       LD              A,B                     ; OBTAIN ENCODING
38200                       ADD             A,A                     ; FOR NEW CHARACTER
38250                       LD              E,A                     ; ORIGINAL FREQUENCY
38300                       LD              HL,ENCODER.NC.ENCODING.TABLE
38350                       ADD             HL,DE                   ; SAVE ADDRESS OF
38400                       LD              C,(HL)                  ; ENCODED DIGIT
38450                       INC             HL                      ; WHILE WRITING ZONE
38500                       PUSH            HL
38550                       ENCODE.VARIABLE.FIELD           WC1,1
38600                       POP             HL                      ; LOAD SAVED ADDRESS
38650                       LD              C,(HL)                  ; AND WRITE DIGIT
38700                       ENCODE.VARIABLE.FIELD           WC2,0
38750                       LD              A,(ENCODER.FREQUENCY)
38800                       CP              01EH
38850                       JP              NZ,PFX&WCH
38900                       LD              C,040H
38950                       ENCODE.VARIABLE.FIELD           WC3,B
39000   PFX&WCH:
```

```
39050                   LD           A,(VARIANT.TERMINAL.WORD.TYPE)
39100                   BIT          0,A
39150                   JP           Z,PFX&WXT
39200                   LD           C,080H
39250                   LD           A,(ENCODER.CURRENT.CHAR)
39300                   RLCA
39350                   RR           C
39400                   ENCODE.VARIABLE.FIELD     WC4,B
39450   PFX&WXT:
39500                   ENDM
39550;******************************************************************
39600
39650   WRITE.ENCODED.FONT            MACRO        PFX
39700
39750; AT START: B = FT.A
39800;           D = FT.ACTIVE
39850
39900                   LD           A,D
39950                   DEC          A                       ; SET HL =
40000                   ADD          A,A                     ; ((FT.ACTIVE - 1)
40050                   ADD          A,A                     ; * 16) + FT.A) +
40100                   ADD          A,A                     ; ENCODING.TABLE
40150                   ADD          A,A
40200                   ADD          A,B                     ; SET A = ENCODED
40250                   LD           D,0                     ; VALUE FROM (HL)
40300                   LD           E,A                     ; TO PROCESS
40350                   LD           HL,ENCODING.TABLE       ; ENCODE.VARIABLE.
40400                   ADD          HL,DE                   ; FIELD
40450                   LD           C,(HL)
40500                   ENCODE.VARIABLE.FIELD     PFX,B
40550                   ENDM
40600
40650;******************************************************************
40700
40750   ENCODE.VARIABLE.FIELD         MACRO        PFX,BUFFER
40800
40850; AT START: C = FIELD TO BE ENCODED
40900
40950                 ! IFT          "&BUFFER" NE "O"
41000                   LD           A,(ENCODING.BUFFER)
41050                 ! ENDIF
41100   PFX&EVL:
41150                   SLA          C
41200                   JR           Z,PFX&EFX
41250   PFX&EVB:
41300                   RRA
41350                   JP           NC,PFX&EVL
41400                   LD           B,A
41450                   PUSH         BC
41500                   CALL         ENCODER.STORE.FIFO.ENMX
41550                   POP          BC
41600                   LD           A,080H
41650                   JP           PFX&EVL
41700   PFX&EFX:
41750                 ! IFT          "&BUFFER" NE "I"
41800                   LD           (ENCODING.BUFFER),A
41850                 ! ENDIF
41900                   ENDM
41950;*************** D E C O D E R   M A C R O S **********************
42000
42050   DECODE.FONT     MACRO        PFX
42100
42150; AT START: D = FT.ACTIVE
42200; AT END:   A = FT.A
42250                                                        ; FT.ACTIVE IS 1-N;
42300                   DEC          D                       ; MAKE 0-RELATIVE
42350                   LD           HL,DE.FONT.TABLE.INDEX
42400                   LD           E,D
42450                   LD           D,0                     ; USE DE.FONT.TABLE.
42500                   ADD          HL,DE                   ; INDEX TO POINT TO
```

```
42550                LD      E,(HL)                  ; FT.ACTIVE-TH TABLE
42600                LD      HL,DE.FONT.TABLE        ; STARTING ENTRY FOR
42650                ADD     HL,DE                   ; USE IN HL
42700                LD      A,(DECODING.BUFFER)
42750                LD      B,A                     ; SET A,B TO CURRENT
42800   PFX&DFS:                                     ; DECODING OCTET
42850                LD      A,1
42900                CP      B                       ; IF CURRENT OCTET
42950                JP      NZ,PFX&DFG              ; IS 0, GET NEXT
43000                PUSH    HL                      ; OCTET, ELSE GET
43050                CALL    DECODER.FETCH.FIFO.MRDE
43100                POP     HL                      ; RESTORE D,HL AND
43150                LD      D,0                     ; GET NEXT BIT VALUE
43200                XOR     A
43250                SRL     B                       ; BIT 0 TO CARRY & A
43300                RLA                             ; AND SET FLAG BIT
43350                SET     7,B                     ; IN BIT 7 OF B
43400                JP      PFX&DFH
43450   PFX&DFG:
43500                XOR     A                       ; CLEAR A AND SHIFT
43550                SRL     B                       ; BIT 0 OF B INTO A
43600                RLA
43650   PFX&DFH:
43700                LD      E,A                     ; ADD BIT VALUE TO
43750                ADD     HL,DE                   ; HL POINTER AND
43800                LD      C,(HL)                  ; TEST TO SEE IF
43850                LD      A,C                     ; BIT PATTERN HAS
43900                AND     00FH                    ; BEEN COMPLETED
43950                JP      Z,PFX&DFF
44000                LD      E,A                     ; IF NOT, ADVANCE
44050                ADD     HL,DE                   ; HL POINTER AND
44100                JP      PFX&DFS                 ; RETURN FOR NEXT BIT
44150   PFX&DFF:
44200                LD      A,B
44250                LD      (DECODING.BUFFER),A
44300                LD      A,C                     ; SAVE DECODING.FIELD
44350                AND     0F0H                    ; .BUFFER
44400                RRCA
44450                RRCA                            ; SHIFT RIGHT 4 TO
44500                RRCA                            ; GET VALUE OF FT.A
44550                RRCA
44600                ENDM
44650
44700;************************************************************
44750
44800.  DECODE.CHAR    MACRO           PFX,DECOMI,DECOMX,DECHAR
44850
44900                LD      D,0                     ; SET HL TO START OF
44950                LD      HL,DE.ZONE.TABLE        ; DE.ZONE.TABLE
45000                LD      A,(DECODING.BUFFER)
45050                LD      B,A                     ; SET A,B TO CURRENT
45100   PFX&DZL:                                     ; DECODING OCTET
45150                LD      A,1
45200                CP      B                       ; IF CURRENT OCTET
45250                JP      NZ,PFX&DZG              ; IS 0, GET NEXT
45300                PUSH    HL                      ; OCTET, ELSE GET
45350                CALL    DECODER.FETCH.FIFO.MRDE
45400                POP     HL                      ; RESTORE D,HL AND
45450                LD      D,0                     ; GET NEXT BIT VALUE
45500                XOR     A
45550                SRL     B                       ; BIT 0 TO CARRY & A
45600                RLA                             ; AND  SET FLAG BIT
45650                SET     7,B                     ; IN BIT 7 OF B
45700                JP      PFX&DZH
45750   PFX&DZG:
45800                XOR     A                       ; CLEAR A AND SHIFT
45850                SRL     B                       ; BIT 0 OF B INTO A
45900                RLA
45950   PFX&DZH:
46000                LD      E,A                     ; ADD BIT VALUE TO
```

```
46050                ADD           HL,DE                      ; HL POINTER AND
46100                LD            C,(HL)                     ; TEST TO SEE IF
46150                LD            A,C                        ; BIT PATTERN HAS
46200                AND           0FOH                       ; BEEN COMPLETED
46250                JP            NZ,PFX&DZD
46300                LD            E,C                        ; IF NOT, ADVANCE
46350                ADD           HL,DE                      ; HL POINTER AND
46400                JP            PFX&DZL                    ; RETURN FOR NEXT BIT
46450  PFX&DZD:
46500                RRCA                                     ; SHIFT RIGHT 4 TO
46550                RRCA                                     ; GET NUMBER OF BITS
46600                RRCA                                     ; IN DIGIT VALUE &
46650                RRCA                                     ; STORE IN C (VIA E)
46700                LD            E,A
46750                LD            A,C                        ; SET E =
46800                AND           0OFH                       ; DE.DIGIT.TABLE
46850                LD            C,E                        ; POINTER
46900                LD            E,A
46950                LD            HL,DE.DIGIT.TABLE
47000                ADD           HL,DE                      ; DERIVE FREQUENCY
47050                LD            A,(HL)                     ; INCREMENT FOR THIS
47100                PUSH          AF                         ; ZONE & STORE IN C
47150                DECODE.FIXED                 PFX
47200                POP           AF
47250                ADD           A,B
47300                CP            01EH
47350                JP            Z,PFX&DCM
47400  PFX&DCH:                                               ; GET NEXT C BITS SET
47450                LD            D,0                        ; UP IN B TO ADD TO
47500                LD            E,A                        ; ZONE INCREMENT
47550                LD            HL,DECODER.NC.CHAR.VALUE
47600                ADD           HL,DE
47650                OR            A                          ; STORE NC.CHAR.VALUE
47700                LD            A,(HL)                     ; AS CURRENT.CHARACTR
47750                LD            (DECODER.CURRENT.CHAR),A
47800                JP            Z,PFX&DCO                  ; IF TOTAL INCREMENT
47850                DEC           HL                         ; > 0, SWAP CHARACTER
47900                LD            B,(HL)                     ; WITH NEXT LOWER
47950                LD            (HL),A                     ; ENTRY TO MAINTAIN
48000                INC           HL                         ; TABLE FREQUENCY
48050                LD            (HL),B
48100  PFX&DCO:
48150                LD            A,(VARIANT.TERMINAL.WORD.TYPE)
48200                BIT           0,A
48250                JP            Z,DECHAR
48300                LD            A,(DECODING.BUFFER)
48350                LD            B,A
48400                LD            C,1
48450                DECODE.FIXED                 DCO
48500                XOR           A
48550                CP            B
48600                JP            Z,DECHAR
48650                LD            HL,DECODER.CURRENT.CHAR
48700                SET           7,(HL)
48750                JP            DECHAR
48800  PFX&DCM:
48850                LD            A,(DECODING.BUFFER)
48900                LD            B,A
48950                LD            C,1
49000                DECODE.FIXED                 DC1
49050                XOR           A
49100                CP            B
49150                LD            A,01EH
49200                JP            Z,PFX&DCH
49250                LD            A,(DECODING.BUFFER)
49300                LD            B,A
49350                LD            C,1
49400                DECODE.FIXED                 DC2
49450                XOR           A
49500                CP            B
49550                JP            Z,DECOMI
49600                LD            A,(DECODING.BUFFER)
49650                LD            B,A
49700                LD            C,4
49750                DECODE.FIXED                 DC3
```

```
49800                   JP              DECOMX
49850                   ENDM
49900
49950;**************************************************
50000
50050   DECODE.FIXED    MACRO           PFX
50100
50150; AT START: B = DECODING.BUFFER
50200;           C = NUMBER OF BITS TO BE FETCHED
50250; AT END:   B = FETCHED BITS (RIGHT JUSTIFIED)
50300
50350                   LD              D,B
50400                   LD              B,0
50450   PFX&DFS:
50500                   LD              A,1
50550                   CP              D               ; IF CURRENT OCTET IS
50600                   JP              NZ,PFX&DFG      ; EMPTY, GET NEXT
50650                   PUSH            BC              ; NEXT OCTET, ELSE
50700                   CALL            DECODER.FETCH.FIFO.MRDE
50750                   LD              D,B
50800                   POP             BC
50850                   SRL             D               ; BIT 0 TO CARRY & B
50900                   RL              B               ; AND SET FLAG BIT
50950                   SET             7,D             ; IN BIT 7 OF D
51000                   JP              PFX&DFH
51050   PFX&DFG:
51100                   SRL             D               ; SHIFT BIT TO CARRY
51150                   RL              B               ; AND INTO B
51200   PFX&DFH:                                        ; ...........WHEN
51250                   DEC             C               ; BIT COUNTER = 0,
51300                   JP              NZ,PFX&DFS      ; SAVE DECODING.FIELD
51350                   LD              A,D             ; .BUFFER & RETURN
51400                   LD              (DECODING.BUFFER),A
51450                   ENDM
51500
51550;**************************************************
51600
51650   WRITE.DECODED.CHAR MACRO        PFX
51700
51750   PFX&WCS:
51800                   LD              A,(DECODER.CURRENT.CHAR)
51850                   LD              B,A
51900                   CALL            DECODER.STORE.FIFO.DETX
51950                   ENDM
```

What is claimed is:

1. A system for the dynamic encoding of a stream of characters, the system comprising:
an input for receiving the stream of characters;
an output for providing encoded data;
means, hereinafter referred to as "followset means," connected to the input, for storing, accessing, and updating, for each given character of a plurality of characters, a table listing the set of candidates for the character which may follow the given character in the stream, such table hereinafter referred to as a "followset table";
followset identification means, connected to the input, for identifying the followset table, hereinafter the "given followset table," for that character which immediately precedes a given character in the stream at the input;
position encoding means for providing at the output, for the given character, a signal indicative of the position, occupied by the given character, in the followset table identified by the followset identification means; and
updating means for updating a given followset table periodically when the position of a candidate therein has been signaled by the encoding means at the output, by interchanging the position of such candidate, unless such candidate is at the top of the followset table, with the position of a candidate thereabove in the given followset table.

2. A system for the dynamic encoding of a stream of characters, the system comprising:
an input for receiving the stream of characters;
an output for providing encoded data;
means, hereinafter referred to as "followset means," connected to the input, for storing, accessing and updating for each given character of a plurality of characters, a table listing the set of candidates for the character which may follow the given character in the stream, such table hereinafter referred to as a "followset table," wherein each followset table includes a candidate, hereinafter the "new character symbol," to identify a "new character," i.e., any character that is not otherwise listed as a candidate in the table and wherein all the candidates in such table are stored in approximate order of their local frequency of occurence after the character with which the table is associated; and
new character encoding means for providing at the output, when a new character condition has been identified, a representation for the new character.

3. A system according to claim 2, wherein the new character encoding means includes means for supressing the position encoding means from providing an output of a signal indicative of the position of the new character symbol whenever the given followset table includes only the new character symbol and no other candidates.

4. A system according to claim 2, wherein the new character encoding means includes a new character frequency table that stores identifiers for all characters, in order of their approximate local frequency of occurrence as new characters, and the representation for the new character is based on the new character's position in the new character frequency table.

5. A system according to claim 4, wherein the new character encoding means includes means for updating the new character frequency table, each time a new character is represented by recourse thereto, by interchanging the position therein of the identifier for such new character, unless the identifier is at the top of the new character frequency table, with the position of an identifier thereabove.

6. A system according to claim 2, further comprising updating means for updating a given followset table periodically when the position of a candidate therein has been signaled by the encoding means at the output, by interchanging the position of such candidate, unless such candidate is at the top of the followset table, with the position of a candidate thereabove in the given followset table.

7. A system according to claim 5, further comprising updating means for updating a given followset table periodically when the position of a candidate therein has been signaled by the encoding means at the output, by interchanging the position of such candidate, unless such candidate is at the top of the followset table, with the position of a candidate thereabove in the given followset table.

8. A system according to claim 1, wherein each possible character in the stream of characters is classified into one of a plurality of Types and the followset means includes means for storing, accessing and updating a followset table, for each of a plurality of ordered character groups, each group including a last character therein and the Type of the character immediately preceding the last character, i.e., the Type of the next-to-last character, such table listing candidates for the character which may follow, in the stream, the character group with which the table is associated.

9. A system according to claim 8, wherein the character group consists of the last character therein, the Type of the next-to-last character, and the Type of the character immediately preceding the next-to-last character.

10. A system according to claim 8, wherein a first Type substantially includes the 26 capital letters A-Z, a second Type substantially includes the 26 lower case letters a-z, and a third Type substantially includes the 10 decimal numbers 0-9.

11. A system according to claim 9, wherein a first Type substantially includes the 26 capital letters A-Z, a second Type substantially includes the 26 lower case letters a-z, and a third Type substantially includes the 10 decimal numbers 0-9.

12. A decoding system for decoding the output of an encoding system according to claim 1, the decoding system comprising:
a decoding input for receiving the encoded data from the encoding system;
a decoding output for providing a decoded data stream;
decoding followset means, connected to the decoding output, for storing, accessing, and updating a followset table, for each of a plurality of characters, listing candidates for the character which may follow in the decoded data stream, the character with which the table is associated;
decoding followset identification means, connected to the decoding output, for identifying the followset table for that character which has just been decoded;
decoding means, connected to the decoding input, decoding output, and the followset identification means, for providing at the decoding output the character occupying, in that followset table identified by the decoding followset identification means, a position identified by a signal at the decoding input; and
updating means for updating a given followset table periodically when the position of a candidate therein has been signaled by the decoding means at the input, by interchanging the position of such candidate, unless such candidate is at the top of the followset table, with the position of a candidate thereabove in the given followset table.

13. A system according to claim 2, wherein each possible character in the stream of characters is classified into one of a plurality of Types and the followset means includes means for storing, accessing and updating a followset table, for each of a plurality of ordered character groups, each group including a last character therein and the Type of the character immediately preceding the last character, i.e., the Type of the next-to-last character, such table listing candidates for the character which may follow, in the stream, the character group with which the table is associated.

14. A system according to claim 1, wherein the updating means updates a given followset table whenever the position of a candidate therein has been signaled by the encoding means at the output, by interchanging the position of such candidate, unless such candidate is at the top of the followset table, with the position of the candidate immediately thereabove in the given followset table.

15. A system according to claim 8, wherein the updating means updates a given followset table whenever the position of a candidate therein has been signaled by the encoding means at the output, by interchanging the position of such candidate, unless such candidate is at the top of the followset table, with the position of the candidate immediately thereabove in the given followset table.

16. A system according to claim 6, wherein the updating means updates a given followset table whenever the position of a candidate therein has been signaled by the encoding means at the output, by interchanging the position of such candidate, unless such candidate is at the top of the followset table, with the position of the candidate immediately thereabove in the given followset table.

17. A system for encoding a stream of characters and for decoding the encoded system, the system comprising:
an encoder having an input for receiving the stream of characters, an output for providing encoded data means, hereinafter referred to as "followset means," connected to the input, for storing and accessing, for each given character of a plurality of characters, a table listing the set of candidates for the character which may follow the given character in the stream, such table hereinafter referred to as a "followset table," and updating means for updating a given followset table periodically when the position of a candidate therein has been signaled by the encoding means at the output, by interchanging the position of such candidate, unless such candidate is at the top of the followset table, with the position of a candidate thereabove in the given followset table;

a decoder, having an input in communication with the encoder output for receiving the encoded data therefrom, an output for providing a decoded data stream, and decoding followset means, connected to the decoder's output, for storing, accessing, and updating a followset table, for each of a plurality of characters, listing candidates for the character which may follow in the decoded data stream, the character with which the table is associated, in such a way that in normal operation the set of followset tables in the decoder at any given time corresponds to the set of followset tables in the encoder at a corresponding immediately preceding time.

18. A system for the dynamic encoding of a stream of characters, the system comprising:

an input for receiving the stream of characters, each possible character in the stream being classified into one of a plurality of Types;

an output for providing encoded data;

means, hereinafter referred to as "followset means," for storing, accessing, and updating, for each of a plurality of ordered character groups, a table listing the set of candidates for the character which may follow, in the stream, the character group with which the table is associated, such table hereinafter referred to as a "followset table," and each character group including a last character therein and the Type of the character immediately preceding the last character, i.e., the Type of the next-to-last character;

followset identification means, connected to the input, for identifying the followset table, hereinafter the "given followset table," for the character group which immediately precedes a given character in the stream at the input; and position encoding means for providing at the output, for the given character, a signal indicative of the position occupied by the given character in the followset table identified by the followset identification means.

* * * * *